(12) United States Patent
Tanaka et al.

(10) Patent No.: US 9,773,878 B2
(45) Date of Patent: Sep. 26, 2017

(54) SEMICONDUCTOR DEVICE AND MANUFACTURING METHOD THEREOF

(71) Applicant: FUJI ELECTRIC CO., LTD., Kawasaki-shi (JP)

(72) Inventors: Takahide Tanaka, Matsumoto (JP); Masaharu Yamaji, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/793,236

(22) Filed: Jul. 7, 2015

(65) Prior Publication Data

US 2016/0056248 A1 Feb. 25, 2016

(30) Foreign Application Priority Data

Aug. 19, 2014 (JP) ................................ 2014-166277

(51) Int. Cl.
| | |
|---|---|
| H01L 29/40 | (2006.01) |
| H01L 29/739 | (2006.01) |
| H01L 29/66 | (2006.01) |
| H01L 29/78 | (2006.01) |
| H01L 29/861 | (2006.01) |
| H01L 29/06 | (2006.01) |
| H01L 29/417 | (2006.01) |
| H01L 29/08 | (2006.01) |

(Continued)

(52) U.S. Cl.
CPC .......... *H01L 29/405* (2013.01); *H01L 29/063* (2013.01); *H01L 29/0653* (2013.01); *H01L 29/66681* (2013.01); *H01L 29/7395* (2013.01); *H01L 29/7816* (2013.01); *H01L 29/861* (2013.01); *H01L 29/0692* (2013.01); *H01L 29/0878* (2013.01); *H01L 29/1095* (2013.01); *H01L 29/36* (2013.01); *H01L 29/4175* (2013.01)

(58) Field of Classification Search
None
See application file for complete search history.

(56) References Cited

U.S. PATENT DOCUMENTS

| | | | |
|---|---|---|---|
| 5,486,718 A | 1/1996 | Robb et al. | |
| 6,291,305 B1 * | 9/2001 | Huang | ................... H01L 21/64 257/E21.022 |

(Continued)

FOREIGN PATENT DOCUMENTS

| | | |
|---|---|---|
| JP | H08-32031 A | 2/1996 |
| JP | 2013-187240 A | 9/2013 |

*Primary Examiner* — Jesse Y Miyoshi
*Assistant Examiner* — Steven B Gauthier
(74) *Attorney, Agent, or Firm* — Rabin & Berdo, P.C.

(57) ABSTRACT

A semiconductor device includes a first main electrode terminal and second main electrode terminal disposed on the principal surface of a semiconductor substrate so as to be spaced from one another, an insulating film formed on the principal surface of the semiconductor substrate, and a thin film resistance layer. One end side of the thin film resistance layer is connected to the first main electrode terminal and the other end side of the thin film resistance layer is connected to the second main electrode terminal, the thin film resistance layer being spirally formed on the insulating film in such a way as to surround the first main electrode terminal. The thin film resistance layer extends while oscillating in a thickness direction of the semiconductor substrate.

17 Claims, 32 Drawing Sheets

(51) Int. Cl.
*H01L 29/10* (2006.01)
*H01L 29/36* (2006.01)

(56) References Cited

U.S. PATENT DOCUMENTS

2011/0291157 A1* 12/2011 Takahashi ........... H01L 29/0696
257/144
2013/0161740 A1* 6/2013 Disney .................. H01L 29/405
257/339

* cited by examiner

SEMICONDUCTOR DEVICE AND MANUFACTURING METHOD THEREOF

CROSS-REFERENCE TO RELATED APPLICATIONS

The entire disclosure of a corresponding Japanese patent application, Serial No. JP PA 2014-166277, filed Aug. 19, 2014, is hereby incorporated by reference.

BACKGROUND OF THE INVENTION

1. Field of the Invention

The present invention relates to a semiconductor device and a manufacturing method thereof, and in particular, relates to a technology which is effectively applied to a semiconductor device having a resistive field plate formed on a semiconductor substrate via an insulating film and to a method of manufacturing the semiconductor device.

2. Description of the Background Art

A power device is utilized in many fields such as, apart from a motor control inverter, a power source application for an FPD (Flat Panel Display), such as a high capacity PDP (Plasma Display Panel) or a liquid crystal panel, and a home inverter for an air conditioner or lighting. As this kind of power device, an IGBT (Insulated Gate Bipolar Transistor) or a power MOSFET is known.

Heretofore, the drive and control of the power device has been carried out by an electronic circuit configured by combining a semiconductor element such as a photocoupler and an electronic part such as a transformer. However, in recent years, owing to the advancement of LSI (Large-Scale Integration) technology, a high voltage IC(Integrated Circuit) with a breakdown voltage level of 100V to 1200V, which is used in consumer power supplies of AC100V and 200V, an industrial power supply of AC400V, and the like, has been put to practical use.

In the high voltage IC, it is often the case that a breakdown voltage structure (a structure of a portion in charge of breakdown voltage) portion includes a capacitive field plate (MFFP) or resistive field plate (RFP) formed of a high-resistance polysilicon thin film. The capacitive field plate or the resistive field plate is such that as it has the function of relaxing the electric field concentration on a depletion layer of a semiconductor surface, it is possible to stably secure a high breakdown voltage.

This kind of field plate is formed on a semiconductor layer via an insulating film, but an example of providing undulations in the semiconductor layer or insulating film under the field plate in order to further enhance the effect of electric field relaxation, is reported. For example, in JP-A-8-32031, the insulating film is made larger in thickness in the outer side portion of a spiral field plate than in the inner side portion. Also, in JP-A-2013-187240, grooves are formed in the semiconductor layer small ineffective thickness, and the insulating film and the field plate are formed so as to fill the grooves. In both JP-A-8-32031 and JP-A-2013-187240, the boundaries of the undulations are formed so as to be parallel to the field plate.

However, in the breakdown voltage structure of the high voltage IC, as a leak current when a high voltage is applied is generated in only a junction region when the capacitive field plate is provided, the leak current is as very small as several nA to several μA or less, but the enforceability of a potential on a depletion layer of the front surface of the semiconductor layer is low, and reliability is low compared with in the resistive field plate.

Meanwhile, when the resistive field plate is provided, the enforceability of a potential on the depletion layer of the front surface of the semiconductor layer is high, and reliability is comparatively high, but the leak current when a high voltage is applied is as large as several μA to several ten μA compared with in the capacitive field plate. That the leak current is large means that a leak current from a high voltage terminal to a ground terminal is large in a high voltage IC, and that the power consumption of the IC increases.

Consequently, when using the resistive field plate in the breakdown voltage structure, it is required, in order to reduce the power consumption when the IC is on standby, to increase the total resistance value of the resistive field plate and reduce the leak current.

Therefore, the present inventors have contrived the invention focusing attention on the shape of a thin film resistance layer (a resistive thin film layer) used as the resistive field plate.

SUMMARY OF THE INVENTION

An object of the invention is to provide a technology whereby it is possible, in a semiconductor device, to achieve a reduction in power consumption when on standby.

In order to achieve the object, the gist of the invention is that a semiconductor device according to one aspect of the invention includes a first main electrode terminal disposed on the principal surface of a semiconductor substrate; a second main electrode terminal provided, away from the first main electrode terminal, in a position on the principal surface which surrounds the first main electrode terminal; an insulating film formed on the principal surface between the first main electrode terminal and the second main electrode terminal; and a thin film resistance layer, one end side of which is connected to the first main electrode terminal and the other end side of which is connected to the second main electrode terminal, which circles spirally on the insulating film in such a way as to surround the first main electrode terminal, wherein the thin film resistance layer circles while oscillating in a thickness direction of the semiconductor substrate.

Also, the gist of the invention is that a semiconductor device manufacturing method according to one aspect of the invention includes a step of forming on the principal surface of a semiconductor substrate an insulating film having undulations wherein a plurality of depressions circle continuously; a step of forming on the insulating film a thin film semiconductor layer of the thickness reflecting the pattern of the undulations; a step of introducing impurities into the thin film semiconductor layer and thus forming a thin film resistance layer as a spiral pattern so as to surround the center of the principal surface; and a step of forming a first main electrode terminal, which is connected to one end side of the thin film resistance layer, in a region of the center which is surrounded by the pattern of the thin film resistance layer and a second main electrode terminal, which is connected to the other end side of the thin film resistance layer, on the outer side of the thin film resistance layer.

According to the invention, it is possible to achieve a reduction in power consumption when the semiconductor device is on standby.

BRIEF DESCRIPTION OF THE DRAWINGS

FIGS. 2A and 2B are diagrams showing an outline configuration of the semiconductor device according to the first embodiment of the invention, wherein FIG. 2A is a sectional view showing a sectional structure along the line IIa-IIa of FIG. 1, and FIG. 2B is a sectional view showing a sectional structure along the line IIb-IIb of FIG. 1.

FIGS. 3A and 3B are diagrams showing an outline configuration of the semiconductor device according to the first embodiment of the invention, wherein FIG. 3A is a sectional view showing in enlarged dimension a sectional structure along the line IIc-IIc of FIG. 1, and FIG. 3B is a main portion sectional view showing one portion of FIG. 3A.

FIGS. 4A and 4B are diagrams for illustrating a method of manufacturing the semiconductor device according to the first embodiment of the invention, wherein FIG. 4A is a sectional view in a position corresponding to the line IIa-IIa of FIG. 1, and FIG. 4B is a sectional view in a position corresponding to the line IIb-IIb of FIG. 1.

FIGS. 5A and 5B are diagrams for illustrating the method of manufacturing the semiconductor device according to the first embodiment of the invention, wherein FIG. 5A is a sectional view in a position corresponding to the line IIa-IIa of FIG. 1, and FIG. 5B is a sectional view in a position corresponding to the line IIb-IIb of FIG. 1.

FIGS. 7A and 7B are diagrams for illustrating the method of manufacturing the semiconductor device according to the first embodiment of the invention, wherein FIG. 7A is a sectional view in a position corresponding to the line IIa-IIa of FIG. 1, and FIG. 7B is a sectional view in a position corresponding to the line IIb-IIb of FIG. 1.

FIGS. 8A and 8B are diagrams for illustrating the method of manufacturing the semiconductor device according to the first embodiment of the invention, wherein FIG. 8A is a sectional view in a position corresponding to the line IIa-IIa of FIG. 1, and FIG. 8B is a sectional view in a position corresponding to the line IIb-IIb of FIG. 1.

FIGS. 9A and 9B are diagrams for illustrating the method of manufacturing the semiconductor device according to the first embodiment of the invention, wherein FIG. 9A is a sectional view in a position corresponding to the line IIa-IIa of FIG. 1, and FIG. 9B is a sectional view in a position corresponding to the line IIb-IIb of FIG. 1.

FIGS. 10A and 10B are diagrams for illustrating the method of manufacturing the semiconductor device according to the first embodiment of the invention, wherein FIG. 10A is a sectional view in a position corresponding to the line IIa-IIa of FIG. 1, and FIG. 10B is a sectional view in a position corresponding to the line IIb-IIb of FIG. 1.

FIGS. 11A and 11B are diagrams for illustrating the method of manufacturing the semiconductor device according to the first embodiment of the invention, wherein FIG. 11A is a sectional view in a position corresponding to the line IIa-IIa of FIG. 1, and FIG. 11B is a sectional view in a position corresponding to the line IIb-IIb of FIG. 1.

FIGS. 13A and 13B are diagrams for illustrating the method of manufacturing the semiconductor device according to the first embodiment of the invention, wherein FIG. 13A is a sectional view in a position corresponding to the line IIa-IIa of FIG. 1, and FIG. 13B is a sectional view in a position corresponding to the line IIb-IIb of FIG. 1.

FIGS. 15A and 15B are diagrams for illustrating the method of manufacturing the semiconductor device according to the first embodiment of the invention, wherein FIG. 15A is a sectional view in a position corresponding to the line IIa-IIa of FIG. 1, and FIG. 15B is a sectional view in a position corresponding to the line IIb-IIb of FIG. 1.

FIGS. 16A and 16B are diagrams showing an outline configuration of a semiconductor device according to a second embodiment of the invention, wherein FIG. 16A is a sectional view showing a sectional structure in a position corresponding to the line IIa-IIa of FIG. 1, and FIG. 16B is a sectional view showing a sectional structure in a position corresponding to the line IIb-IIb of FIG. 1.

FIGS. 18A and 18B are diagrams showing an outline configuration of the semiconductor device according to the third embodiment of the invention, wherein FIG. 18A is a sectional view showing a sectional structure along the line IIIa-IIIa of FIG. 17, and FIG. 18B is a sectional view showing a sectional structure along the line IIIb-IIIb of FIG. 17.

FIGS. 20A and 20B are diagrams showing an outline configuration of a semiconductor device according to a fourth embodiment of the invention, wherein FIG. 20A is a sectional view showing a sectional structure in a position corresponding to the line IIIa-IIIa of FIG. 17, and FIG. 20B is a sectional view showing a sectional structure in a position corresponding to the line IIIb-IIIb of FIG. 17.

FIGS. 22A and 22B are diagrams showing an outline configuration of a semiconductor device according to a sixth embodiment of the invention, wherein FIG. 22A is a sectional view showing a sectional structure in a position corresponding to the line IIa-IIa of FIG. 1, and FIG. 22B is a sectional view showing a sectional structure in a position corresponding to the line IIb-IIb of FIG. 1.

FIGS. 24A and 24B are diagrams for illustrating a method of manufacturing the semiconductor device according to the sixth embodiment of the invention, wherein FIG. 24A is a sectional view in a position corresponding to the line IIa-IIa of FIG. 1, and FIG. 24B is a sectional view in a position corresponding to the line IIb-IIb of FIG. 1.

FIGS. 25A and 25B are diagrams for illustrating the method of manufacturing the semiconductor device according to the sixth embodiment of the invention, wherein FIG. 25A is a sectional view in a position corresponding to the line IIa-IIa of FIG. 1, and FIG. 25B is a sectional view in a position corresponding to the line IIb-IIb of FIG. 1.

FIGS. 26A and 26B are diagrams for illustrating the method of manufacturing the semiconductor device according to the sixth embodiment of the invention, wherein FIG. 26A is a sectional view in a position corresponding to the line IIa-IIa of FIG. 1, and FIG. 26B is a sectional view in a position corresponding to the line IIb-IIb of FIG. 1.

FIGS. 28A and 28B are diagrams for illustrating the method of manufacturing the semiconductor device according to the sixth embodiment of the invention, wherein FIG. 28A is a sectional view in a position corresponding to the line IIa-IIa of FIG. 1, and FIG. 28B is a sectional view in a position corresponding to the line IIb-IIb of FIG. 1.

FIGS. 31A and 31B are diagrams for illustrating the method of manufacturing the semiconductor device according to the sixth embodiment of the invention, wherein FIG. 31A is a sectional view in a position corresponding to the line IIa-IIa of FIG. 1, and FIG. 31B is a sectional view in a position corresponding to the line IIb-IIb of FIG. 1.

DETAILED DESCRIPTION OF THE INVENTION

Figure 1:
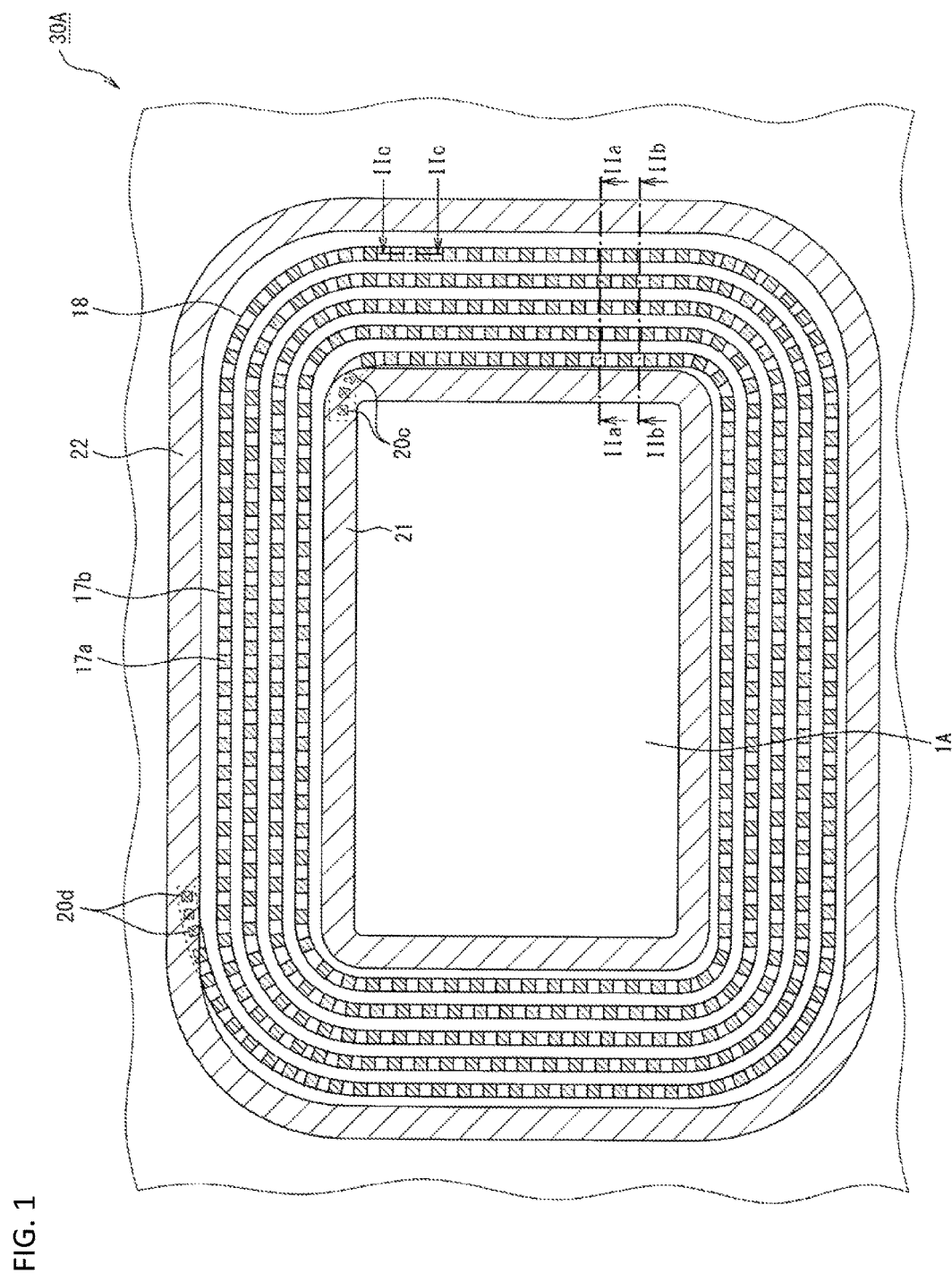
FIG. 1 is a main portion plan view showing an outline configuration of a semiconductor device according to a first embodiment of the invention.

Hereafter, a description will be given, referring to the drawings, of semiconductor devices according to first to sixth embodiments of the invention.

In the present specification, in a field-effect transistor (FET), a "main electrode region" means a semiconductor region of low-specific resistance which forms one of a source region and a drain region. In a diode, the "main electrode region" means a semiconductor region which forms one of an anode region and a cathode region. In an IGBT, as the "main electrode region" means a semiconductor region which forms one of an emitter region and a collector region, the "main electrode region" is an appellation relying on a "semiconductor device". More specifically, in the event that the heretofore mentioned "semiconductor region which forms one" is defined as a "first main electrode region", the "semiconductor region which forms the other" is a "second main electrode region". That is, the "second main electrode region" means: in an FET and a static induction transistor (SIT), a semiconductor region which forms one of the source region and the drain region which does not form the first main electrode region; in a diode, a semiconductor region which forms one of the anode region and the cathode region which does not form the first main electrode region; and in an IGBT, a semiconductor region which forms one of the emitter region and the collector region which does not form the first main electrode region. In the following first to sixth embodiments, an illustrative description will be given, as high voltage active elements, of a high voltage MOSFET and a high voltage diode, but it goes without saying that the high voltage active elements are not limited to a high voltage MOSFET or a high voltage diode.

Also, a "main electrode terminal" means an electrode terminal which is connected to one of the first main electrode region and the second main electrode region. More specifically, in the event that the heretofore mentioned "electrode terminal which is connected to one" is defined as a "first main electrode terminal", an "electrode terminal which is connected to the other" is a "second main electrode terminal".

In the description of the following first to sixth embodiments, an illustrative description will be given of the case in which a first conductivity type is p-type and a second conductivity type is n-type, but by selecting the conductivity types in inverse relation, the first conductivity type may be n-type and the second conductivity type may be p-type.

Also, in the specification and the accompanying drawings, n or p in layers and regions prefixed with n or p means respectively that electrons or holes are majority carriers. Also, + or − suffixed to n or p means respectively that a semiconductor region is relatively high or low in impurity concentration compared with a semiconductor region affixed with no + or −.

In the description and accompanying drawings of the following first to sixth embodiments, like components will be given identical signs, thus omitting a redundant description. Also, the accompanying drawings described in the first to sixth embodiments are not illustrated on an exact scale or at an exact dimensional ratio for ease of visualization or comprehension. The invention is not limited to the description of the first to fifth embodiments, to be described hereafter, unless the gist of the invention is exceeded.

First Embodiment

As shown in FIGS. 1, 2A, 2B, 3A, and 3B, a semiconductor device 30A according to the first embodiment of the invention includes a first conductivity type ($p^-$-type) semiconductor substrate 1 and a first main electrode terminal 21 and second main electrode terminal 22 disposed on the principal surface of the semiconductor substrate 1. The semiconductor substrate 1 is formed of, for example, a monocrystalline silicon substrate. The second main electrode terminal 22 is disposed in a position, on the principal surface of the semiconductor substrate 1, surrounding the first main electrode terminal 21 so as to be spaced from the first main electrode terminal 21.

Also, the semiconductor device 30A according to the first embodiment includes an insulating film 16 formed on the principal surface of the semiconductor substrate 1 between the first main electrode terminal 21 and the second main electrode terminal 22, a thin film resistance layer (resistive thin film layer) 18 which is a resistive field plate, and a planar gate type high voltage MOSFET 26 acting as a high voltage active element. The thin film resistance layer 18, one end side of which is connected to the first main electrode terminal 21 and the other end side of which is connected to the second main electrode terminal 22, is formed in a spiral circle shape, in such a way as to surround the first main electrode terminal 21, on the insulating film 16 between the first main electrode terminal 21 and the second main electrode terminal 22. The high voltage MOSFET 26 is formed on the principal surface of the semiconductor substrate 1 between the first main electrode terminal 21 and the second main electrode terminal 22.

The first main electrode terminal 21 and the second main electrode terminal 22 are annularly formed on the principal surface of the semiconductor substrate 1 in such a way as to surround a circuit formation region 1A of the principal surface of the semiconductor substrate 1, and the shape in plan of the first main electrode terminal 21 and second main electrode terminal 22 is formed in a quadrate belt-like frame shape. The first main electrode terminal 21 is disposed inside the second main electrode terminal 22 in such a way as to be spaced from the second main electrode terminal 22.

The insulating film 16 is formed on the principal surface of the semiconductor substrate 1, as shown in FIGS. 2A, 2B, 3A, 3B, and the like. In the first embodiment, the insulating film 16 is formed of a composite film including a first insulating film (selective oxide film) 14 selectively formed on the principal surface of the semiconductor substrate 1 by a selective oxidation method and a second insulating film (deposited film) 15 deposited on the principal surface of the semiconductor substrate 1 in such a way as to cover the first insulating film 14.

Figure 2A:
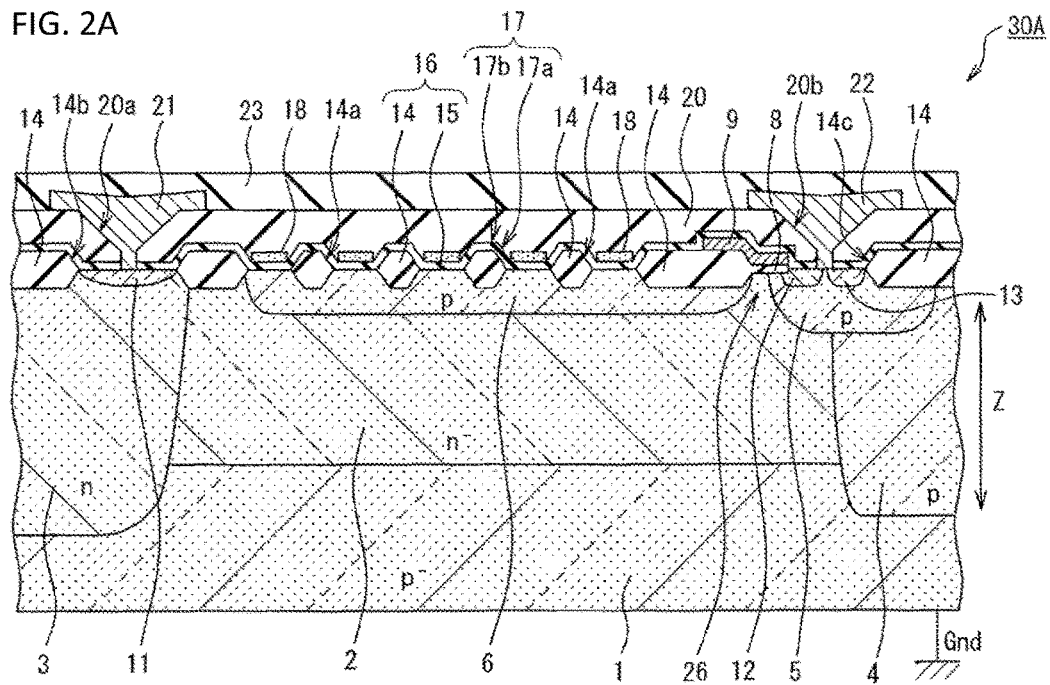
Figure 2B:
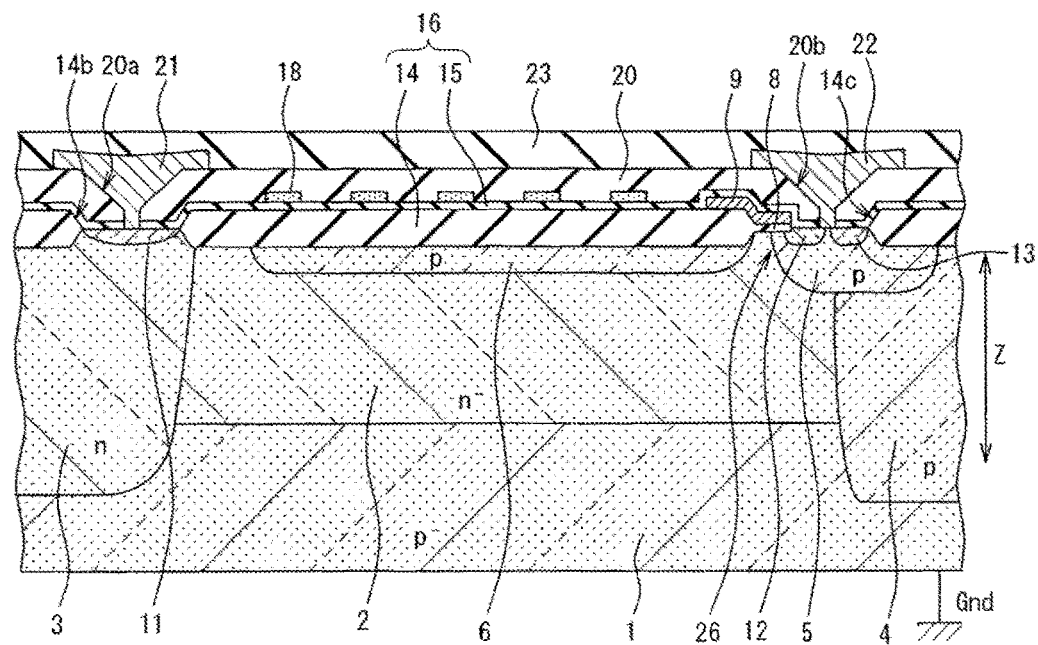

The first insulating film 14 has a first main electrode region window portion 14b, a second main electrode region window portion 14c, and a plurality of depression window portions 14a, as shown in FIGS. 2A, 2B, and the like. The second insulating film 15 is formed on the front surface of the principal surface of the semiconductor substrate 1 which is in the inner portion of the first main electrode region window portion 14b, second main electrode region window portion 14c, and depression window portions 14a. Further, as can be seen from FIGS. 2A and 2B, the first main electrode region window portion 14b is disposed in a position overlapping the first main electrode terminal 21, and the second main electrode region window portion 14c is disposed in a position overlapping the second main electrode terminal 22, in a thickness direction (Z direction) of the semiconductor substrate 1. The plurality of depression window portions 14a are disposed on a breakdown voltage region of the high voltage MOSFET 26 between the first main electrode terminal 21 and the second main electrode terminal 22. Each of the first main electrode region window portion 14b, second main electrode region window portion 14c, and depression window portions 14a is defined by the first insulating film 14 and depressed lower than the first insulating film 14.

As shown in FIG. 1, the thin film resistance layer 18, one end side of which is connected to the first main electrode terminal 21 and the other end side of which is connected to the second main electrode terminal 22, is spirally formed in such a way as to surround the first main electrode terminal 21. As shown in FIGS. 2A and 2B, the thin film resistance layer 18 is formed on the insulating film 16, and the top of the thin film resistance layer 18 is covered with an interlayer insulating film 20.

The high voltage MOSFET 26 is formed on the principal surface of the semiconductor substrate 1. The high voltage MOSFET 26 has a configuration of having mainly a second conductivity type (n⁻-type) offset region 2, a first conductivity type (p-type) channel formation region (base region) 5, a first conductivity type (p-type) offset region 6, a gate insulating film 8, a gate electrode 9, a second conductivity type (n⁺-type) first main electrode region 11 acting as a drain region, a second conductivity type (n⁺-type) second main electrode region 12 acting as a source region, and a first conductivity type (p-type) pickup region 13.

The insulating film 16 is used as the underlying film of the thin film resistance layer 18, and has a configuration of having undulations 17 on the front surface of the insulating film 16, in the breakdown voltage region of the high voltage MOSFET 26. Of the undulations 17 of the front surface of the insulating film 16, depressions 17a are formed by the depression window portions 14a of the first insulating film 14, and projections 17b are formed by the first insulating film 14. That is, the undulations 17 of the front surface of the insulating film 16 are formed by the presence or absence of the first insulating film 14 when viewed positively, and are formed by the presence or absence of the depression window portions 14a of the first insulating film 14 when viewed negatively. The first insulating film 14 is formed to a film thickness of, for example, on the order of 0.6 μm. The second insulating film 15 is formed to a film thickness of, for example, on the order of 0.1 μm. Each of the first and second insulating films 14 and 15 is formed of, for example, a silicon dioxide film.

The thin film resistance layer 18 is disposed on the breakdown voltage region of the high voltage MOSFET 26 with the insulating film 16 interposed therebetween. The thin film resistance layer 18 is formed along the undulations 17 of the insulating film 16 so as to reflect the undulations 17 of the insulating film 16. That is, as can be understood from the topology shown in FIG. 1, that the thin film resistance layer 18 circles spirally in such a way as to surround the first main electrode terminal 21 while oscillating (meandering) in the thickness direction (Z direction) of the semiconductor substrate 1 in such a way as to be disposed upon the depressions 17a and projections 17b of the insulating film 16. Reflect may mean reproduce a shape of the undulations including the projections 17b and depressions 17a. In the first embodiment, the depressions 17a of the undulations 17 of the insulating film 16, in other words, the depression window portions 14a of the first insulating film 14 are disposed, underneath the thin film resistance layer 18, as a cyclic dot pattern in a circling direction of the thin film resistance layer 18. Consequently, the thin film resistance layer 18 shows a cyclic serpentine pattern going up and down in a saw-toothed form, along with the undulations 17 of the insulating film 16, in the thickness direction (Z direction) of the semiconductor substrate 1, as shown in the sectional views of FIGS. 3A and 3B, while the thin film resistance layer 18 has a topology in which it circles spirally so as to surround the first main electrode terminal 21 in a planar direction of the semiconductor substrate 1, as shown in the plan view of FIG. 1.

The thin film resistance layer 18 is formed of, for example, an impurity ion implanted polycrystalline silicon film (doped polysilicon film). As impurity ions, for example, boron (B) ions or boron difluoride ($BF_2$) ions are used, and are doped so that the surface concentration of the thin film resistance layer 18 is, for example, on the order of $1 \times 10^{17}$/cm³ to $1 \times 10^{20}$/cm³. It is preferable to form the thin film resistance film 18 to a width, and at intervals, of 1 μm or more. The depressions 17a of the insulating film 16 are formed to a width equal to the width of the thin film resistance layer 18.

As can be seen from FIGS. 2A and 2B, the n⁻-type offset region 2 is disposed in an upper portion (surface layer portion) on the principal surface side of the semiconductor substrate 1 in a position between the first main electrode terminal 21 and the second main electrode terminal 22 when seen in a direction perpendicular to the principal surface of the semiconductor substrate 1. A second conductivity type (n-type) well region 3 is disposed on the first main electrode terminal 21 side (the inner side) of the offset region 2, and a first conductivity type (p-type) well region 4 is disposed on the second main electrode terminal 22 side (the outer side)

of the offset region 2, in respective upper portions on the principal surface side of the semiconductor substrate 1 in such a way as to be in contact with the offset region 2. The well region 3 is annularly formed in an extension direction of the first main electrode terminal 21, and the well region 4 is annularly formed in an extension direction of the second main electrode terminal 22. Further, the offset region 2 is also annularly formed, in extension directions of the well regions 3 and 4, between the well region 3 and the well region 4.

The p-type offset region 6 is disposed in an upper portion of the offset region 2 on the principal surface side of the semiconductor substrate 1. The p-type offset region 6 and the n⁻-type offset region 2 configure the breakdown voltage region of the high voltage MOSFET 26, that is, a breakdown voltage structure portion. In order to obtain a desired breakdown voltage, it is desirable to dispose the well region 3 and the offset region 6 away from one another.

The channel formation region 5 is a base region disposed, away from the offset region 6 and over the offset region 2 and well region 4, in an upper portion of the offset region 2 and well region 4 on the principal surface side of the semiconductor substrate 1.

The first main electrode region (drain region) 11 is disposed, away from the offset region 6, in an upper portion of the well region 3 positioned in the inner portion of the first main electrode region window portion 14b of the first insulating film 14. The first main electrode region 11 is disposed in a position overlapping the first main electrode terminal 21 in a plan view from a direction perpendicular to the principal surface of the semiconductor substrate 1. In the first embodiment, the second conductivity type first main electrode region 11 is disposed in the upper portion of the second conductivity type well region 3, as shown in FIGS. 2A and 2B, but the first main electrode region 11 may be disposed in an upper portion of the second conductivity type offset region 2. Also, the first main electrode region 11 may be disposed over respective upper portions of the well region 3 and offset region 2.

The second main electrode region (source region) 12 and the pickup region 13 are disposed in upper portions of the channel formation region (base region) 5 positioned in the inner portion of the second main electrode region window portion 14c of the first insulating film 14, on a plane pattern. The second main electrode region (source region) 12 and the pickup region 13 are disposed in respective positions overlapping the second main electrode terminal 22 when viewed in plan in the direction of the principal surface of the semiconductor substrate 1.

The gate insulating film 8 is formed on the principal surface of the semiconductor substrate 1. The gate insulating film 8 is disposed on the offset region 2 and on the channel formation region 5, between the offset region 6 and the second main electrode region 12, in the inner portion of the second main electrode region window portion 14c of the first insulating film 14. The gate insulating film 8 is formed of a silicon dioxide film ($SiO_2$) fabricated on the principal surface of the semiconductor substrate 1 by, for example, a thermal oxidation method. As a silicon dioxide film, there is a thermal oxide film formed by a thermal oxidation method, or a deposited oxide film formed by a chemical vapor deposition (CVD) method, but in the high voltage MOSFET 26 requiring a high breakdown voltage, it is preferable to use a thermal oxide film superior in denseness as the gate insulating film 8. In the first embodiment of the invention, a description is given, as a high voltage transistor, of the case of using the high voltage MOSFET 26 whose gate insulating film 8 is formed of a silicon dioxide film, but a high voltage transistor may be a high voltage MISFET whose gate insulating film is formed of a silicon nitride film or a stacked film of a silicon nitride film and an oxide film, or the like.

The gate electrode 9 is formed on the channel formation region (base region) 5 with the gate insulating film 8 interposed therebetween, as shown in FIGS. 2A and 2B. The gate electrode 9 is provided on the gate insulating film 8, above the channel formation 5 and above the offset region 2 in the vicinity of the channel formation region 5, and is disposed in such a way that one portion of the gate electrode 9 rides the first insulating film 14 in the direction of the first main electrode region 11. The gate electrode 9 is formed of, for example, an impurity added low-specific resistance polycrystalline silicon film (doped polysilicon film). The top of the gate electrode 9 is covered with the second insulating film 15 and interlayer insulating film 20.

Although the illustration in a plan view is omitted, the first main electrode region (drain region) 11 is annularly formed in the upper portion of the well region 3 along the pattern of the first main electrode terminal 21 shown in FIG. 1. In the same way, the channel formation region 5, the gate insulating film 8, the gate electrode 9, the second main electrode region (source region) 12, and the pickup region 13 are all annularly formed along the pattern of the second main electrode terminal 22 as viewed in plan.

Although not illustrated in detail, the second main electrode terminal 22 is electrically connected to the semiconductor substrate 1. That is, the semiconductor substrate 1 is voltage clamped to the same potential as that of a voltage applied to the second main electrode terminal 22.

Portions of the first main electrode terminal 21 and second main electrode terminal 22 other than the contact portions thereof in contact with the first main electrode region 11, second main electrode region 12, and pickup region 13 are formed on the interlayer insulating film 20. The contact portion of the first main electrode terminal 21 is electrically and metallurgically connected to the first main electrode region (drain region) 11 through a contact hole 20a reaching the principal surface of the semiconductor substrate 1 from the front surface of the interlayer insulating film 20. The contact portion of the second main electrode terminal 22 is electrically and metallurgically connected to the second main electrode region (source region) 12 and pickup region 13 through a contact hole 20b reaching the principal surface of the semiconductor substrate 1 from the front surface of the interlayer insulating film 20.

Although not illustrated in detail, the first main electrode terminal 21 is further electrically and metallurgically connected to one end side connection portion of the thin film resistance layer 18 through contact holes 20c (refer to FIG. 1) reaching the one end side connection portion of the thin film resistance layer 18 from the front surface of the interlayer insulating film 20. In the same way, although not illustrated in detail, the second main electrode terminal 22 is electrically and metallurgically connected to the other end side connection portion of the thin film resistance layer 18 through contact holes 20d (refer to FIG. 1) reaching the other end side connection portion of the thin film resistance layer 18 from the front surface of the interlayer insulating film 20.

The first main electrode terminal 21 and the second main electrode terminal 22 are each formed of, for example, an aluminum (Al) film or an aluminum alloy film of aluminum-silicon (Al—Si), aluminum-copper (Al—Cu), aluminum-copper-silicon (Al—Cu—Si), or the like.

A protection film 23 is formed on the interlayer insulating film 20 in such a way as to cover the first main electrode terminal 21 and second main electrode terminal 22. The interlayer insulating film 20 is formed of, for example, a silicon dioxide film. The protection film 23 is formed of, for example, a polyimide insulating resin.

In the semiconductor device 30A according to the first embodiment, a channel is formed on the front surface of the channel formation region (base region) 5 below the gate electrode 9 by the surface potential of the high voltage MOSFET 26 being controlled by a voltage applied to the gate electrode 9. Carriers move from the second main electrode region (source region) 12 to the first main electrode region (drain region) 11 through the channel below the gate electrode 9 and the offset region 2.

Also, the n⁻-type offset region 2 and the p-type offset region 6 are disposed in the breakdown voltage region of the high voltage MOSFET 26. Consequently, a first reference voltage (for example, 0V) is applied to the second main electrode terminal 22, while a second reference voltage (for example, 1200V) higher than the first reference voltage is applied to the first main electrode terminal 21, and when a reverse bias is applied between the second main electrode region (source region) 12 and the first main electrode region (drain region) 11, depletion layers spread in a balanced manner one in each of the p-n junction portion between the p⁻-type semiconductor substrate 1 and the n⁻-type offset region 2 and the p-n junction portion between the n⁻-type offset region 2 and the p-type offset region 6, and the two depletion layers connect together, thereby relaxing an electric field, thus achieving an increase in breakdown voltage.

In particular, as the spiral thin film resistance layer 18 which is a resistive field plate is disposed on the breakdown voltage region of the high voltage MOSFET 26 with the insulating film 16 interposed therebetween, a substantially uniform potential gradient is obtained in the thin film resistance layer 18 owing to a current flowing through the thin film resistance layer 18 when a reverse bias is being applied between the second main electrode region (source region) 12 and the first main electrode region (drain region) 11, and a potential on the substrate side becomes substantially equal to the potential of the spiral thin film resistance layer 18, meaning that it is possible to obtain a stable breakdown voltage.

Figure 3A:
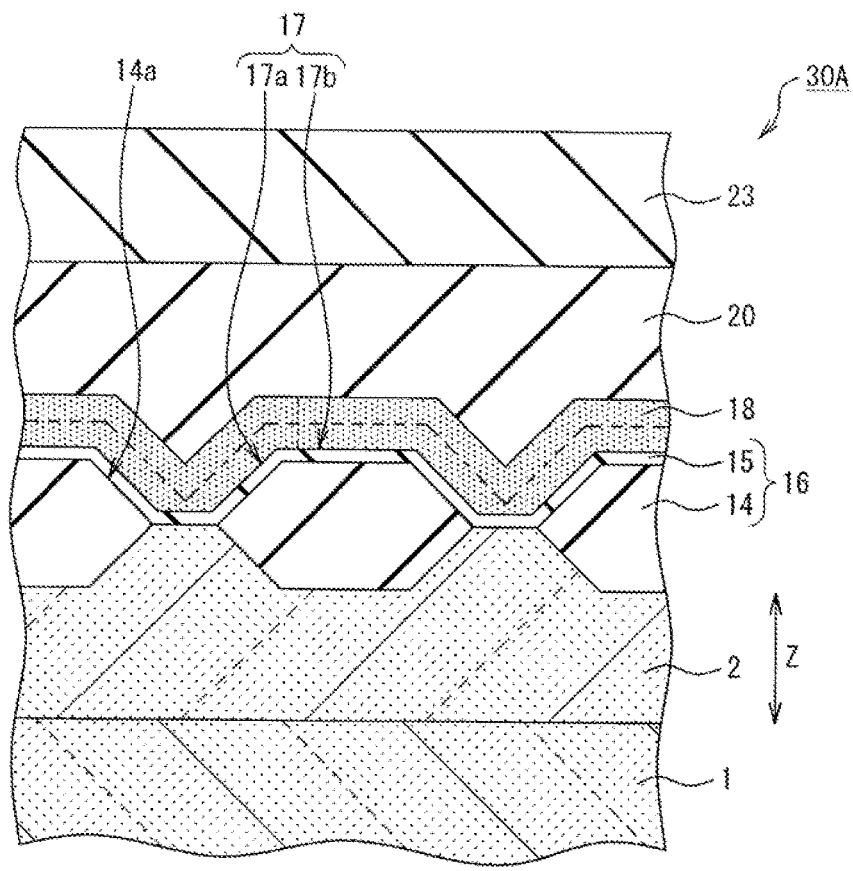
Figure 3B:
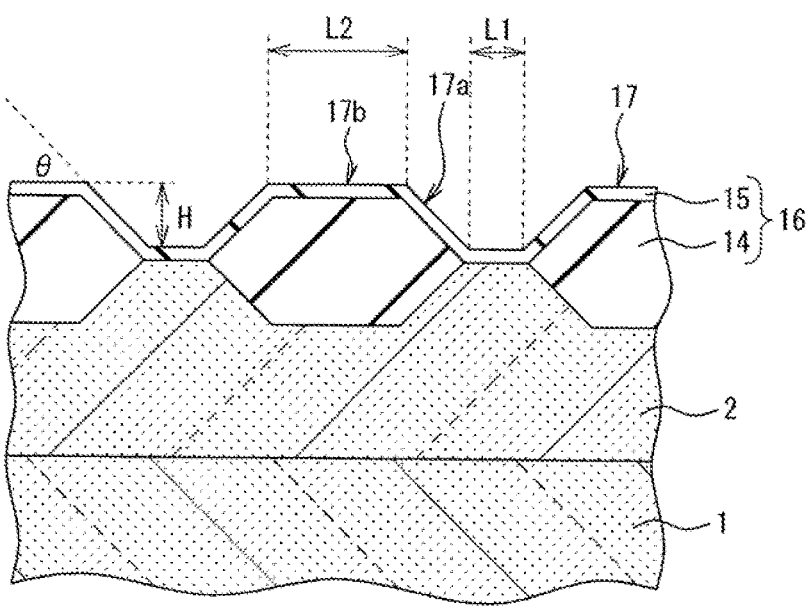

Further, in a section in the circling direction of the thin film resistance layer 18, the undulations 17 of the insulating film 16 are formed so that a level difference H of the undulations 17 of the front surface of the insulating film 16 is 0.6 μm, a length L2 of the projections 17b of the insulating film 16 is about 0.4 μm, a length L1 of the depressions 17a of the insulating film 16 is about 0.14 μm, and a gradient θ of the bird's beak portion of the first insulating film 14 between adjacent depression 17a and projection 17b of the insulating film 16 is about 45 degrees, as shown in FIG. 3B, and when the thin film resistance layer 18 is formed along the undulations 17 so as to reflect the undulations 17, the total extension of the thin film resistance layer 18 is approximately 24% longer than when a thin film resistance layer is formed on a flat insulating film, as heretofore known. The total extension of the thin film resistance layer 18 is the length when the central position in the film thickness direction shown by the dashed lines in the thin film resistance layer 18 of FIG. 3A is taken as a reference.

Therefore, supposing that the total resistance value of the thin film resistance layer when formed on the flat insulating film is 30MΩ and the leak current thereof is 40 μA, the total resistance value becomes 37MΩ and the leak current becomes 32 μA by using the undulations 17 for the thin film resistance layer 18 according to the first embodiment using a plane pattern equivalent to this heretofore known example, and it is possible to realize the pronounced effect of reducing the leak current by 8 μA.

Herein, when using a resistive field plate in the breakdown voltage structure, it is required to increase the total resistance value of the resistive field plate and reduce the leak current in order to reduce power consumption when an IC is on standby.

Therefore, as methods of increasing the total resistance value of the resistive field plate, a. a method of reducing the width and intervals of the thin film resistance layer 18 and increasing the number of turns (hereafter referred to as a "first method"), b. a method of increasing the sheet resistance value itself of the thin film resistance layer 18 (hereafter referred to as a "second method"), c. a method of widening the area of the high breakdown voltage region of the high voltage MOSFET 26 acting as a high voltage active element and increasing the number of turns of the thin film resistance layer 18 (hereafter referred to as a "third method"), and the like, are conceivable.

However, in the case of the first method, the total resistance value increases, but there arises the problem in the processing accuracy of manufacturing process that it is difficult to optimize resist exposure conditions when patterning a thin film semiconductor layer (doped polysilicon film) and thus forming the thin film resistance layer 18, or that the thin film semiconductor layer peels off when etching the thin film semiconductor layer.

Also, as regarding the reduction in the intervals of the thin film resistance layer 18, there also arises the problem that mutually adjacent portions of the thin film resistance layer 18 become increasingly likely to short-circuit due to particles when patterning, or the like.

Also, in the case of the second method, there arises the problem that when the thin film resistance layer 18 is increased to a high resistance of 2.0 kΩ/or more, variation in resistance voltage division ratio and resistance absolute value, or the like, becomes larger, and the accuracy of a resistance element used in a low side drive circuit or control circuit in a high voltage IC also deteriorates. In order to avoid this, it is necessary to use a different high resistance thin film semiconductor layer for only the resistive field plate or form divided implantation masks, but this leads to an increase in process man-hours, thus increasing manufacturing cost.

Also, in the case of the third method, the method of widening the area of the breakdown voltage region of the high voltage MOSFET 26 and increasing the number of turns of the thin film resistance layer 18 is conceivable, but this leads to an increase in the area of chips, and the rate of acquisition of chips acquired from one semiconductor wafer decreases, thus increasing cost.

Meanwhile, according to the semiconductor device 30A according to the first embodiment of the invention, it includes, as a resistive field plate, the thin film resistance layer 18 which circles spirally while oscillating (meandering) in the thickness direction (Z direction) of the semiconductor substrate 1. As the thin film resistance layer 18 circles spirally while oscillating (meandering) in the thickness direction of the semiconductor substrate 1, the effective length of the thin film resistance layer 18 is longer than that of a heretofore known thin film resistance layer extending in a planar direction relative to the thickness direction of the semiconductor substrate 1, and the total resistance value from the first main electrode terminal 21 to the second main electrode terminal 22 is larger, meaning that it is possible to reduce the leak current when a voltage higher than that applied to the second main electrode terminal 22 is applied to the first main electrode terminal 21. As a result of this, according to the semiconductor device 30A according to the first embodiment, it is possible to achieve a reduction in power consumption when on standby.

Also, with the semiconductor device 30A according to the first embodiment, it is possible to curb the problems in the first method, that is, "the problem in the processing accuracy of manufacturing process that it is difficult to optimize resist exposure conditions when patterning a thin film semiconductor layer 18A and thus forming the thin film resistance layer 18, or that the thin film resistance layer 18 peels off when etching the thin film semiconductor layer 18A, and the problem that mutually adjacent portions of the thin film resistance layer 18 short-circuit due to particles when patterning, or the like". Consequently, according to the semiconductor device 30A according to the first embodiment, it is possible to achieve a reduction in power consumption when on standby while achieving an improvement in manufacturing yield, compared with in the first method.

Also, according to the semiconductor device 30A according to the first embodiment, it is possible to increase the total resistance value of the thin film resistance layer 18 even without increasing the sheet resistance value itself of the thin film resistance layer 18. Therefore, it is possible to curb the problem in the second method, that is, "the problem that in order to avoid the problem that when the thin film resistance layer is increased to a high resistance of 2.0 kΩ/or more, variation in resistance voltage division ratio and resistance absolute value, or the like, becomes larger, and the accuracy of a resistance element used in a low side drive circuit or control circuit in a high voltage IC also deteriorates, or the like, it is necessary to use a different high resistance thin film semiconductor layer for only the resistive field plate or form divided ion implantation masks, but this leads to an increase in process man-hours, thus increasing manufacturing cost." Consequently, according to the semiconductor device 30A according to the first embodiment of the invention, it is possible to achieve a reduction in power consumption when on standby while suppressing an increase in manufacturing process man-hours, compared with in the second method.

Also, according to the semiconductor device 30A according to the first embodiment, it is possible to increase the total resistance value of the thin film resistance layer 18 even without widening the area of the breakdown voltage region of the high voltage MOSFET 26 or increasing the number of turns of the thin film resistance layer 18. Therefore, it is possible to curb the problem in the third method, that is, "the problem that the widening of the area of the breakdown voltage region leads to an increase in the area of chips, and the rate of acquisition of chips acquired from one semiconductor wafer decreases, thus increasing cost." Consequently, according to the semiconductor device 30A according to the first embodiment, it is possible to achieve a reduction in power consumption when on standby while suppressing an increase in manufacturing cost.

The thin film resistance layer 18 in the depressions 17a of the insulating film 16 is closer to the semiconductor substrate 1 than the thin film resistance layer 18 on the projections 17b, but as there is little difference in potential between the thin film resistance layer 18 in the depressions 17a and the semiconductor substrate 1, the thin film resistance layer 18 can be sufficiently insulated by the second insulating film 15 of a film thickness of, for example, 0.1 µm.

However, when forming the thin film resistance layer 18 immediately below the metal field plate of the first main electrode terminal 21 and second main electrode terminal 22, a difference in potential occurs between the thin film resistance layer 18 and the semiconductor substrate 1 at this point, meaning that the depressions 17a of the insulating film 16 is not formed in this region.

Also, the width of the depressions 17a of the insulating film 16 is formed to be on the same order as the width of the thin film resistance layer 18, but the width of the depressions 17a may be larger than the width of the thin film resistance layer 18.

Also, in the semiconductor device 30A according to the first embodiment of the invention, a description has been given of the case in which the first conductivity type (p-type) offset region 6 is provided in the breakdown voltage region of the high voltage MOSFET 26, but the invention not being limited to this, the offset region 6 does not have to be provided.

Method of Manufacturing Semiconductor Device According to First Embodiment

Next, a description will be given, using FIGS. 4A to 11B, of a method of manufacturing the semiconductor device 30A according to the first embodiment of the invention.

Firstly, the p⁻-type semiconductor substrate 1 is prepared.

Figure 4A:
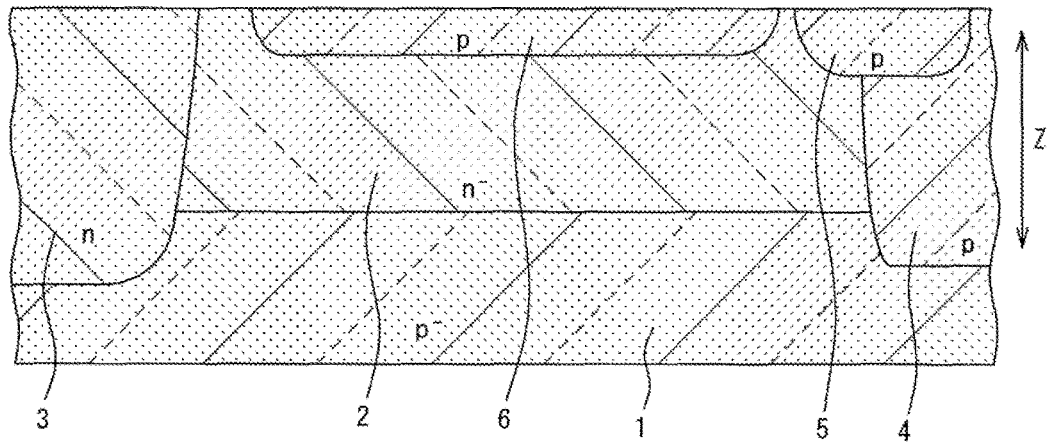
Figure 4B:
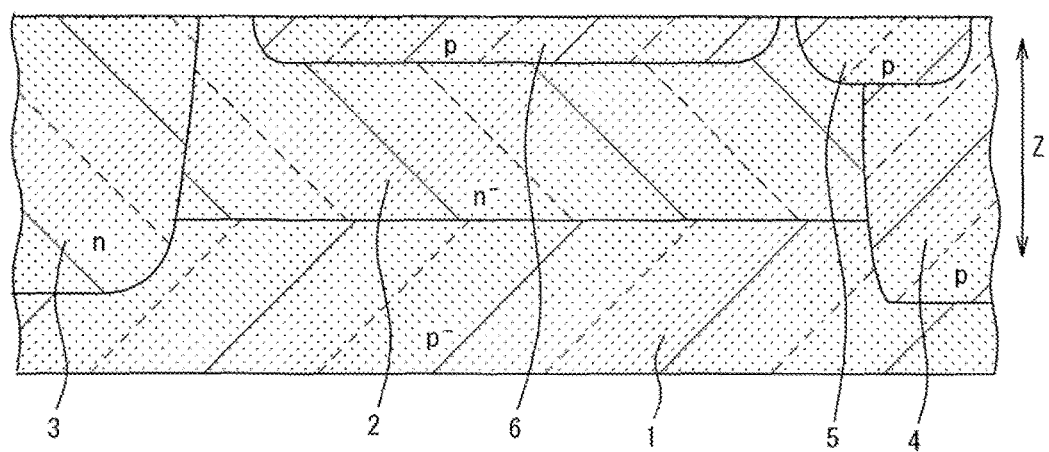

Next, as shown in FIGS. 4A and 4B, the n⁻-type offset region 2, the n-type well region 3, the p-type well region 4, the p-type channel formation region 5, the p-type offset region 6, and the like, are formed in upper portions on the principal surface side of the semiconductor substrate 1. These semiconductor regions are formed by selectively ion implanting, for example, boron (B) as impurity ions for p-type region formation and, for example, phosphorus (P) ions and arsenic (As) ions as impurity ions for n-type region formation into the principal surface of the semiconductor substrate 1, and subsequently, performing heat treatment which activates the ion implanted impurity ions.

Figure 5A:
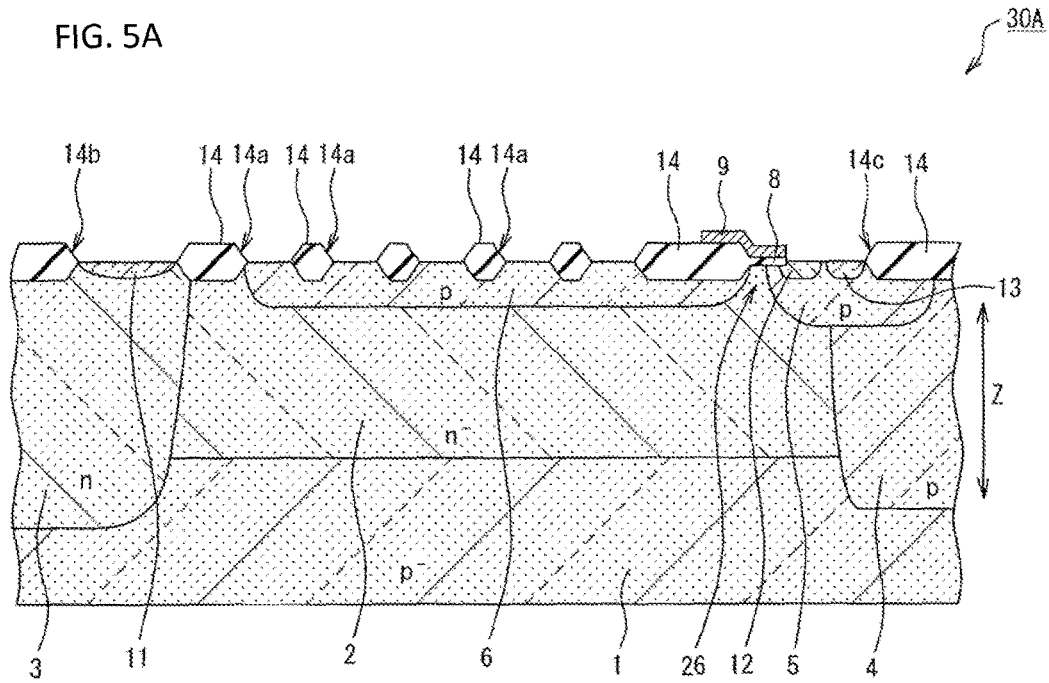
Figure 5B:
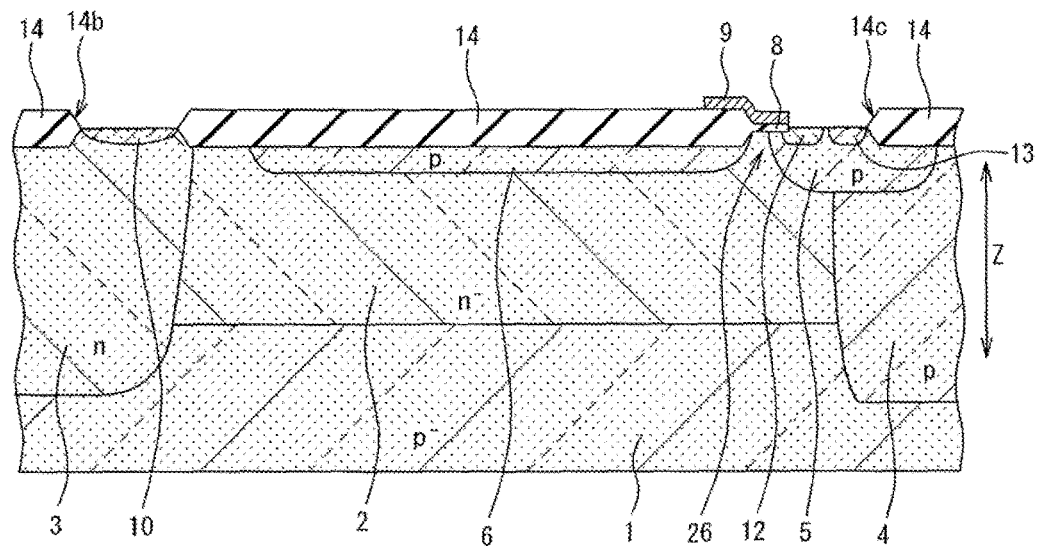
Figure 6:
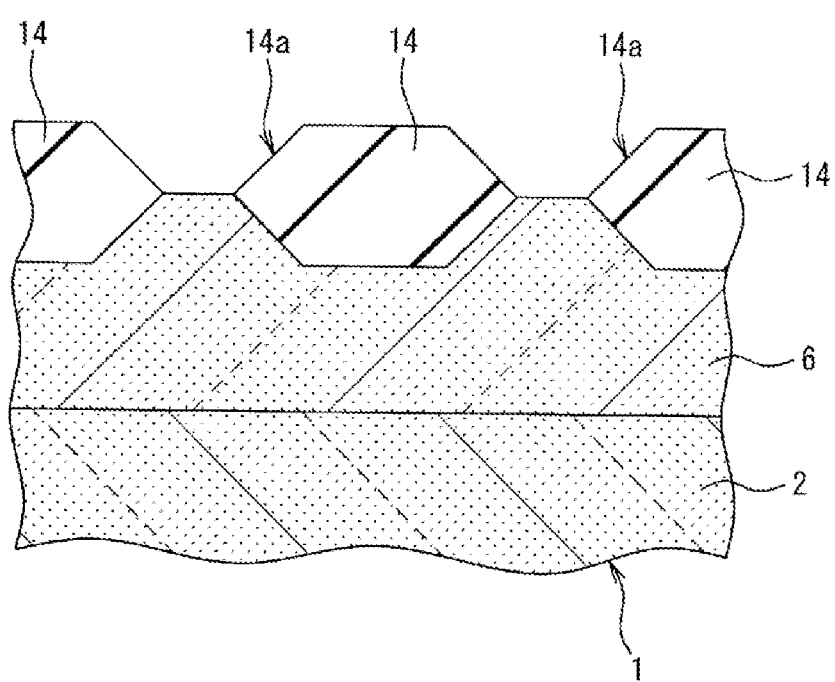
FIG. 6 is a diagram for illustrating the method of manufacturing the semiconductor device according to the first embodiment of the invention, and is a sectional view in a position corresponding to the line IIc-IIc of FIG. 1.

Next, a silicon nitride ($Si_3N_4$) film is deposited as an oxidation resistant film on the principal surface of the semiconductor substrate 1, and the silicon nitride film is patterned using a photolithography technology, thus forming an oxidation resistant mask. Further, the principal surface of the semiconductor substrate 1 is selectively oxidized by a selective oxidation method using the oxidation resistant mask, thus forming the first insulating film (selective oxide film) 14 formed of a silicon oxide film. Subsequently, when the oxidation resistant mask is removed, the pattern of the first insulating film 14 is formed in a non-active region wherein no transistor, including the high voltage MOSFET 26, is formed, as shown in FIGS. 5A and 5B. The first insulating film 14 has the first main electrode region window portion 14b and second main electrode region window portion 14c, and furthermore, has the plurality of depression window portions 14a, as shown in FIG. 6. The plurality of depression window portions 14a provided in the first insulating film 14 are spirally formed as a topology of cyclic dot pattern. The first insulating film 14 is such that the depression window portions 14a continue cyclically in such a way that, for example, the film thickness is on the order of 0.6 µm and the gradient of the bird's beak portions forming the depression window portion 14a of FIG. 6 is approximately 45 degrees.

Figure 7A:
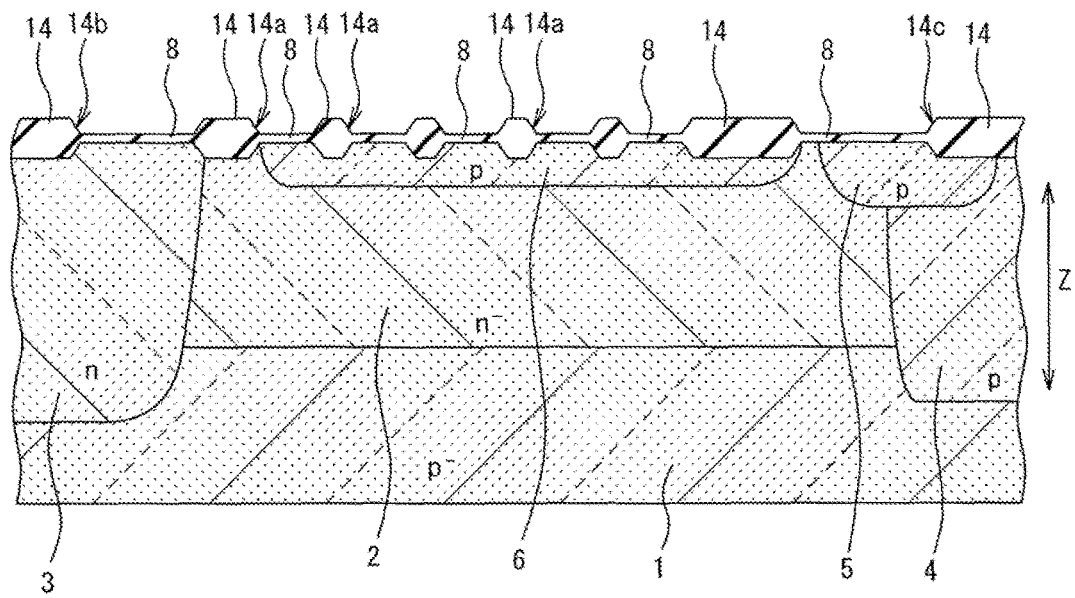
Figure 7B:
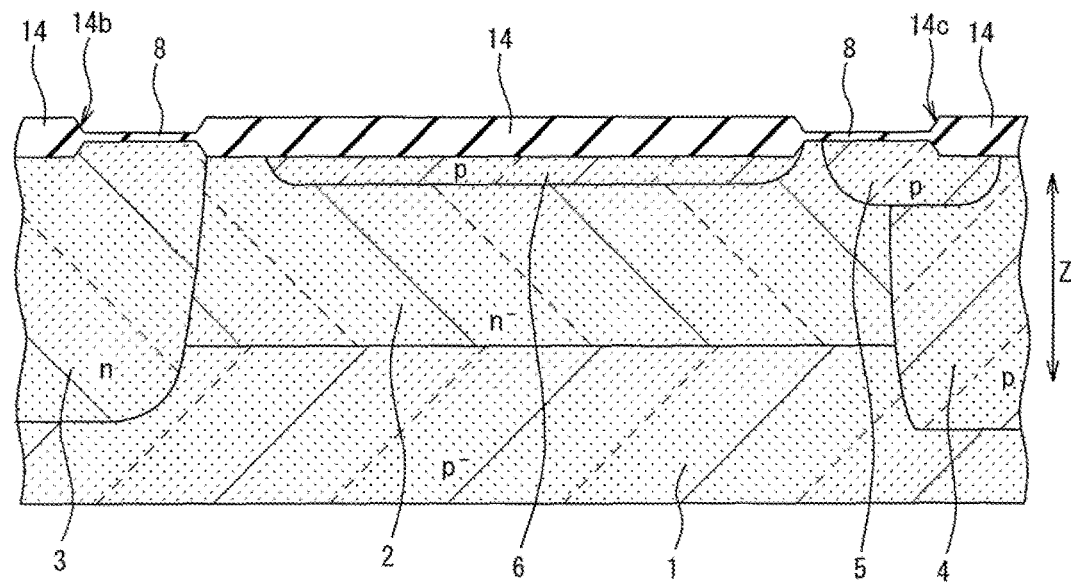

Next, as shown in FIGS. 7A and 7B, on the principal surface of the semiconductor substrate 1, the gate insulating film 8 formed of a silicon dioxide film is formed in the inner portion of the second main electrode region window portion 14c of the first insulating film 14 by, for example, a thermal oxidation treatment. In this step, the gate insulating film 8 is also formed in the first main electrode region window portion 14b and depression window portions 14a of the first insulating film 14, as shown in FIGS. 7A and 7B.

Figure 8A:
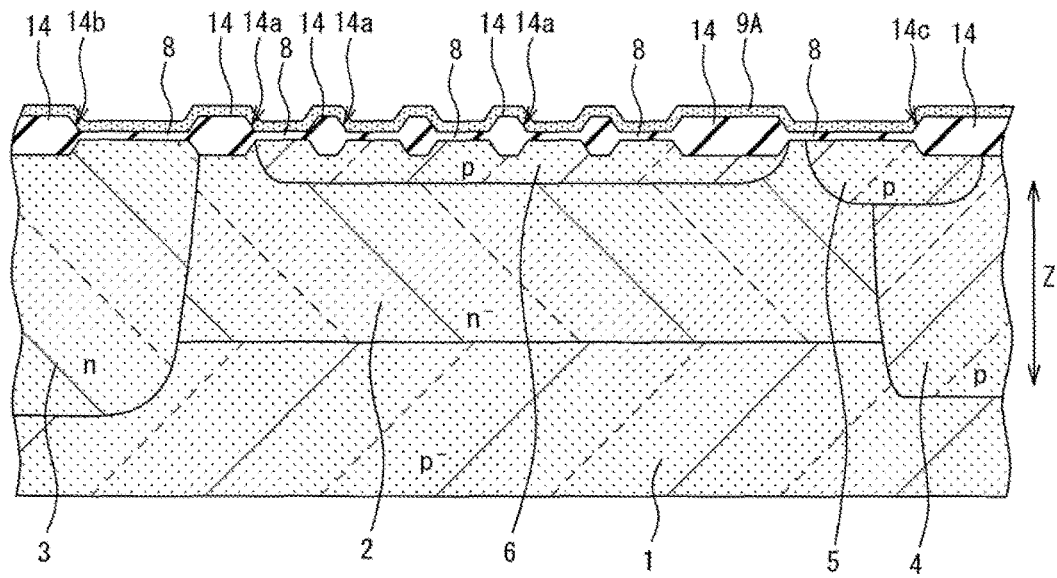
Figure 8B:
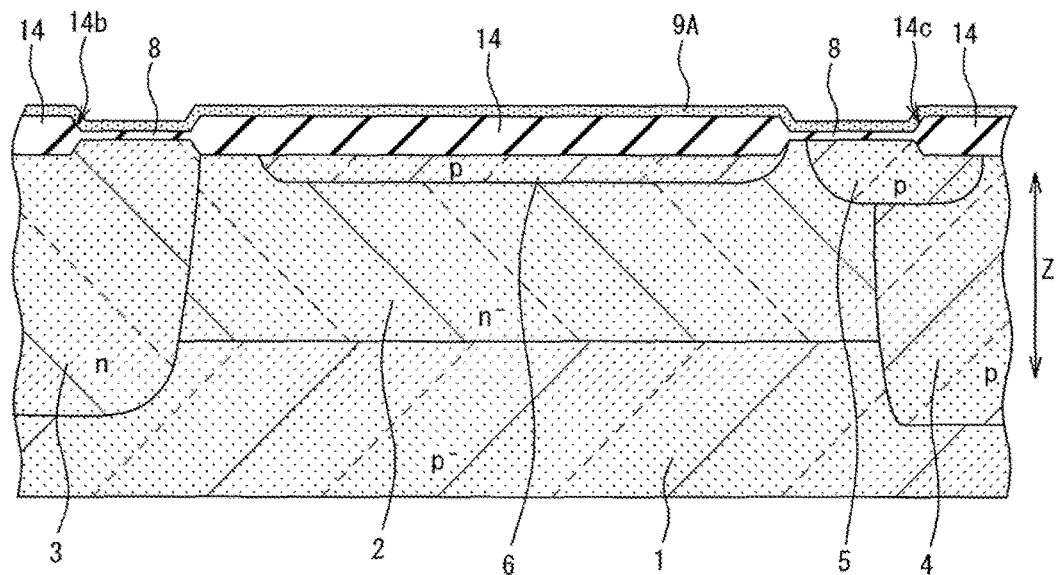
Figure 9A:
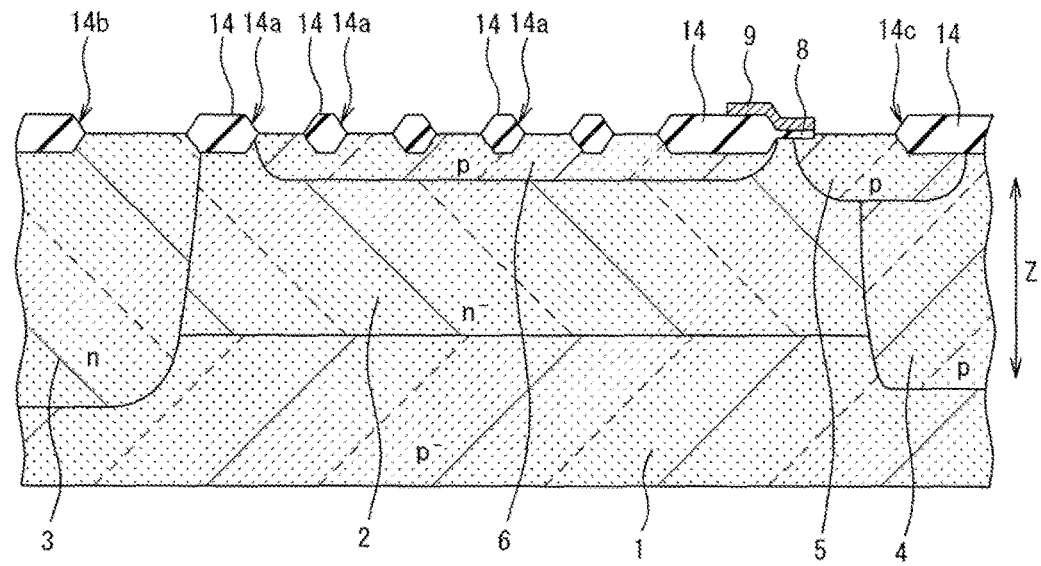
Figure 9B:
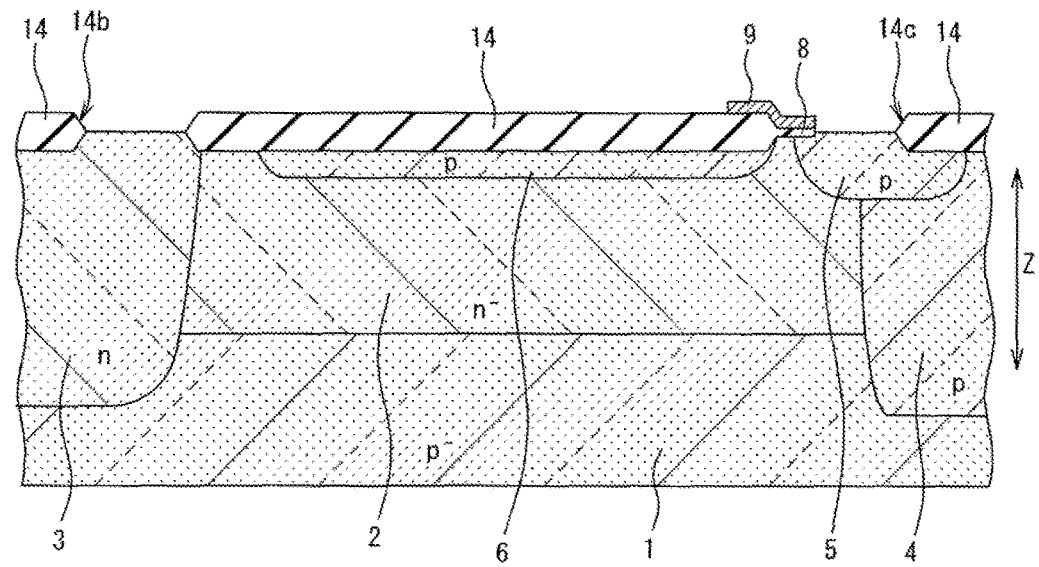

Next, as shown in FIGS. 8A and 8B, for example, an impurity added low-specific resistance polycrystalline silicon film (doped polysilicon film) 9A is formed all over on the principal surface of the semiconductor substrate 1, including on the first insulating film 14 and on the gate insulating film 8. Subsequently, the polycrystalline silicon film 9A is selectively etched using a photolithography technology, a dry etching technology, or the like, thus forming the pattern of the gate electrode 9, as shown in FIGS. 9A and 9B. In this step, the gate insulating film 8 in the inner portion of the first main electrode window portion 14b and depression window portions 14a is removed by over-etching.

Figure 10A:
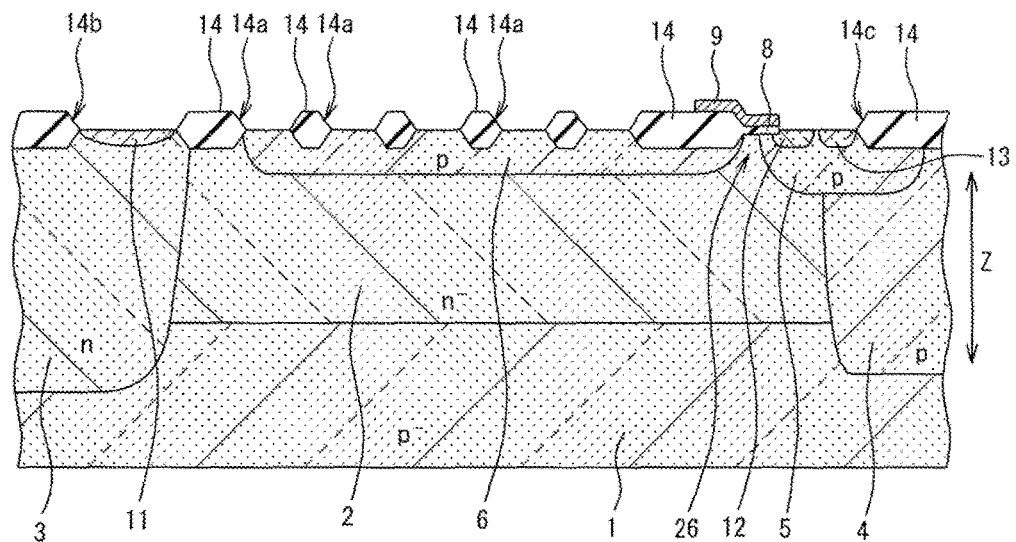
Figure 10B:
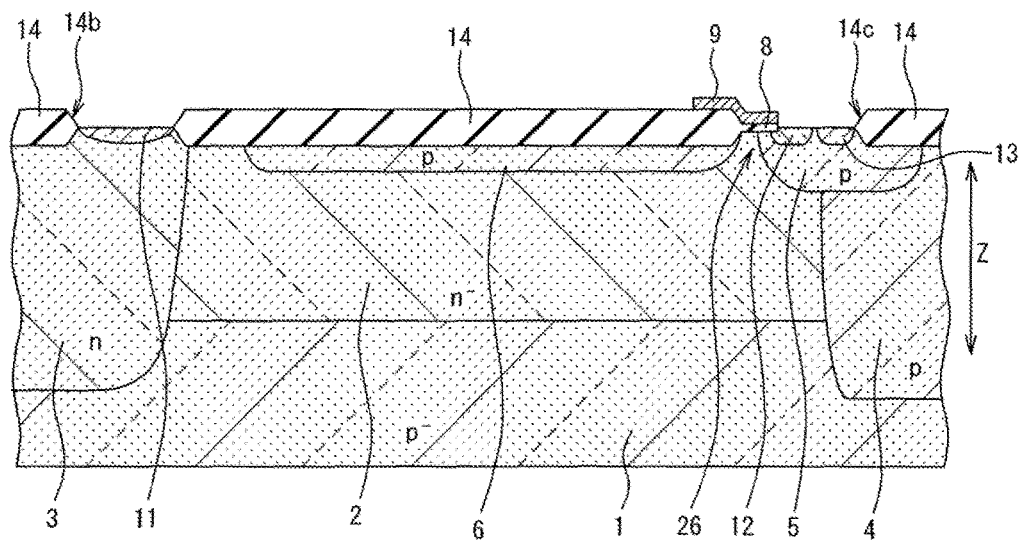

Next, as shown in FIGS. 10A and 10B, as well as the $n^+$-type first main electrode region (drain region) 11 being formed in an upper portion of the well region 3 (or the offset region 2) in the inner portion of the first main electrode region window portion 14b of the first insulating film 14, the $n^+$-type second main electrode region (source region) 12 is formed in an upper portion of the channel formation region 5 in the inner portion of the second main electrode region window portion 14c of the first insulating film 14. The first main electrode region 11 and the second main electrode region 12 are formed by selectively ion implanting impurity ions such as phosphorus (P) ions and arsenic (As) ions, and subsequently, performing heat treatment which activates the ion implanted impurity ions.

Next, as shown in FIGS. 10A and 10B, the first conductivity type ($p^+$-type) pickup region 13 is formed in an upper portion of the channel formation region 5 in the inner portion of the second main electrode region window portion 14c of the first insulating film 14. The pickup region 13 is formed by selectively ion implanting, for example, boron (B) ions as impurity ions, and subsequently, performing heat treatment which activates the ion implanted impurity ions. In this step, the high voltage MOSFET 26 having the $n^-$-type offset region 2 and p-type offset region 6 is formed.

Figure 11A:
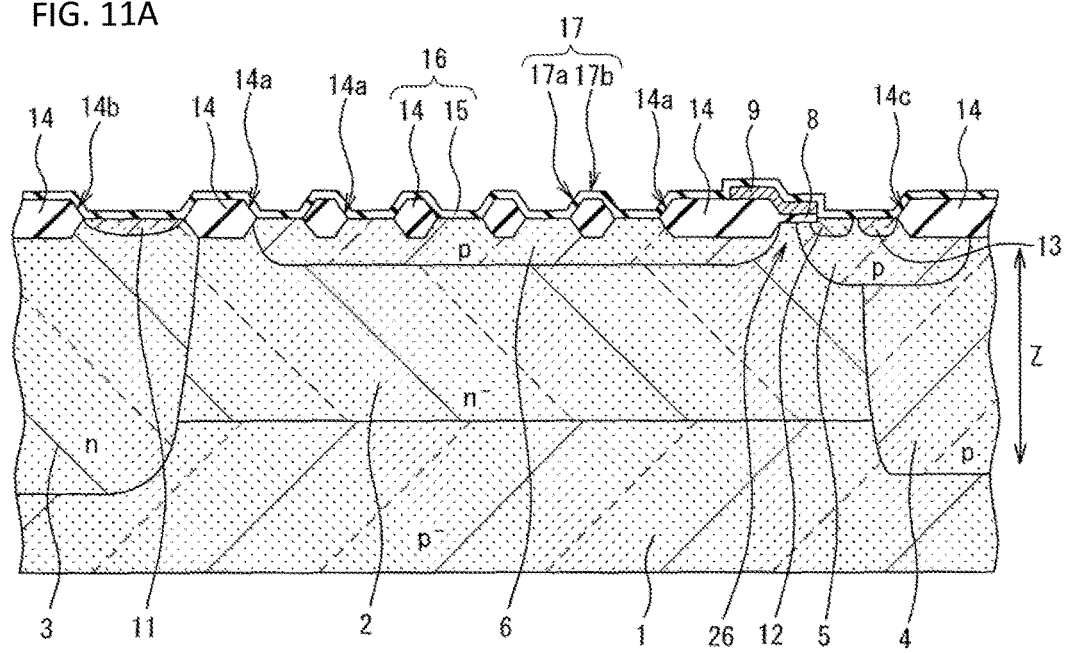
Figure 11B:
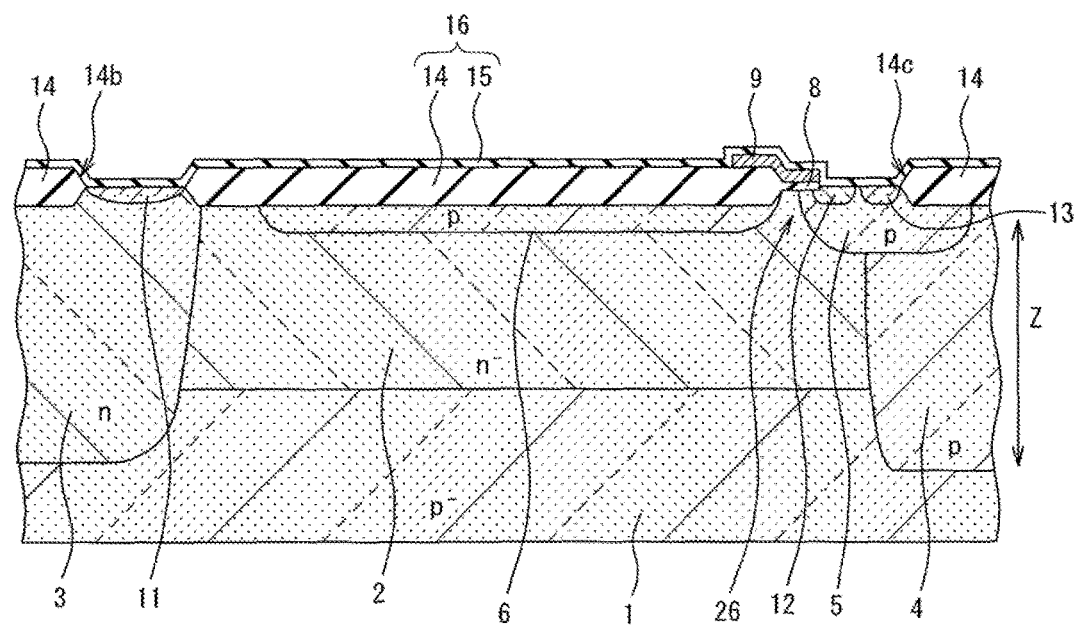
Figure 12:
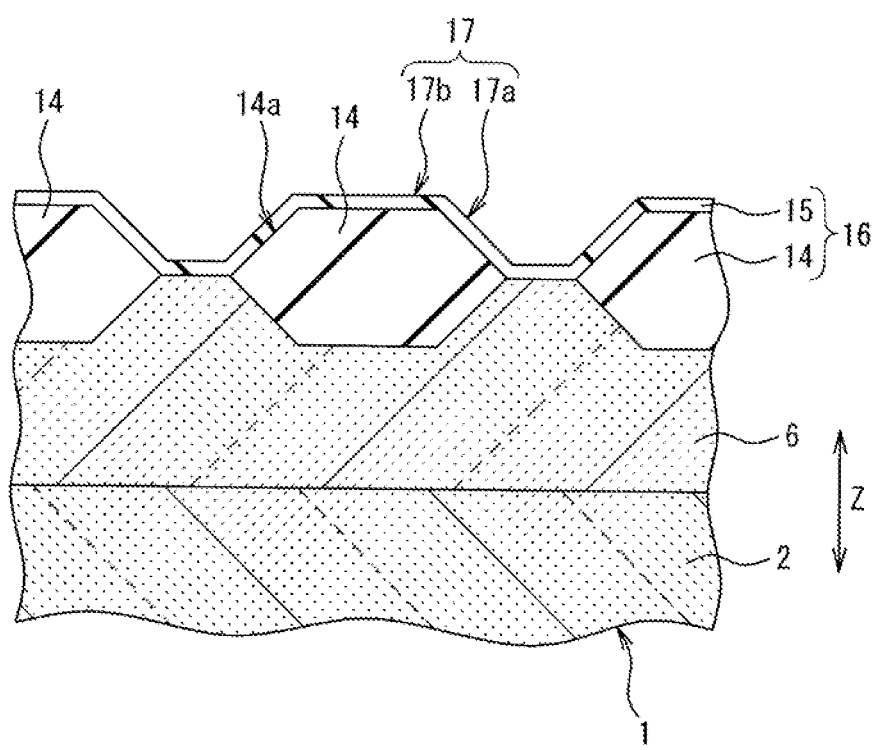
FIG. 12 is a diagram for illustrating the method of manufacturing the semiconductor device according to the first embodiment of the invention, and is a sectional view in a position corresponding to the line IIc-IIc of FIG. 1.

Next, as shown in FIGS. 11A, 11B, and 12, the second insulating film 15 formed of a silicon oxide film is formed all over on the principal surface of the semiconductor substrate 1 by, for example, a CVD method. The second insulating film 15 is formed in such a way as to cover the first insulating film 14, the inner portions of the depression window portions 14a, the inner portion of the first main electrode region window portion 14b, and the inner portion of the second main electrode region window portion 14c. In this step, the insulating film 16, formed of a composite film including the first insulating film 14 and second insulating film 15, which has the undulations 17 on the front surface, is formed. Also, the depressions 17a which the second insulating film 15 configures are formed along the shape in side view of the depression window portions 14a of the first insulating film 14. The second insulating film 15 is formed in a topology of dot pattern in which the plurality of depressions 17a continue cyclically along the depression window portions 14a in a spirally circling direction. The second insulating film 15 is formed to a film thickness of, for example, on the order of 0.1 μm.

Figure 13A:
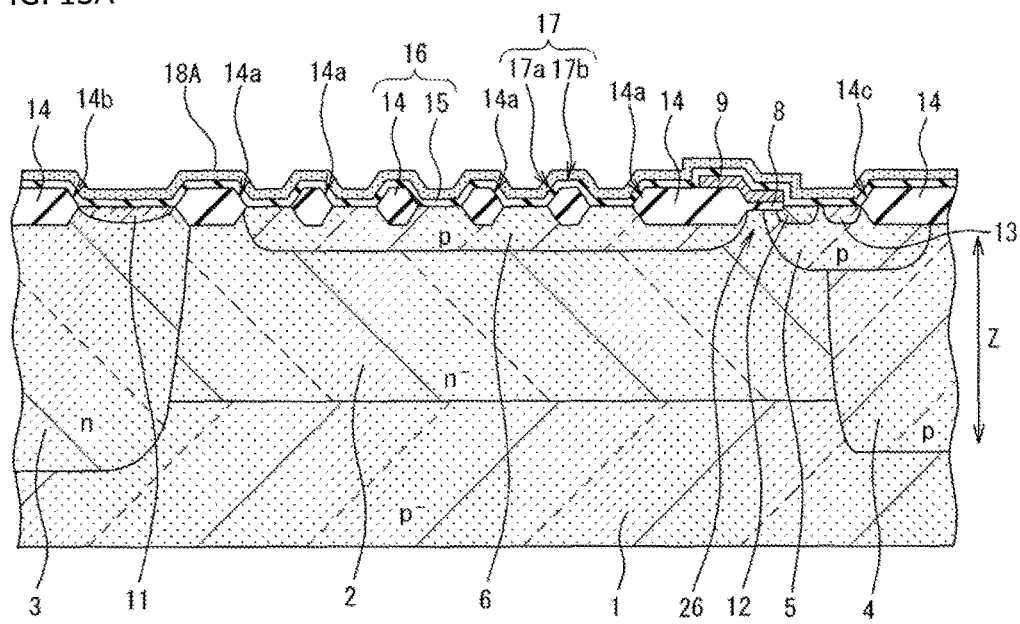
Figure 13B:
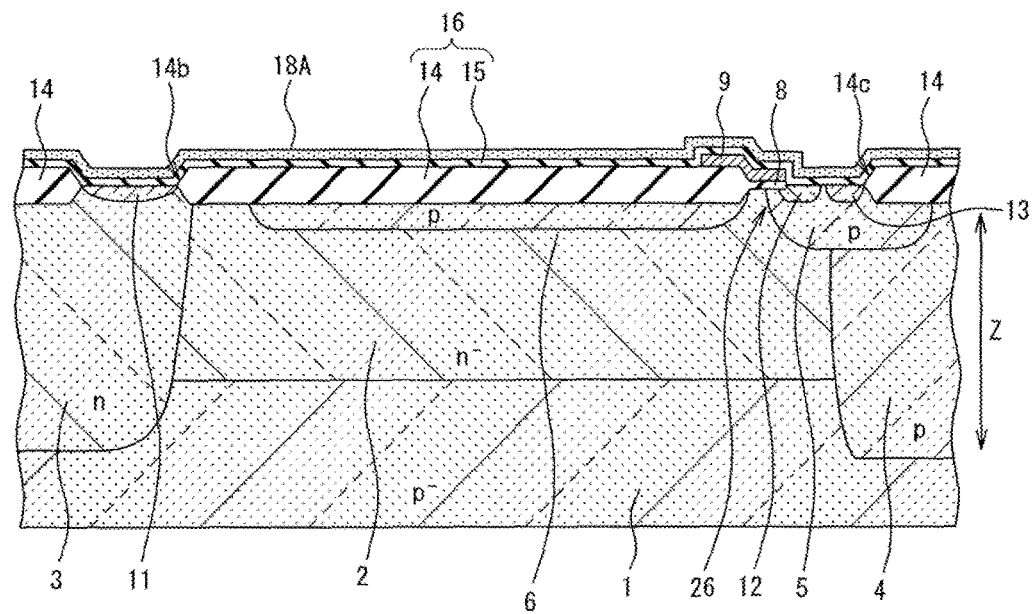
Figure 14:
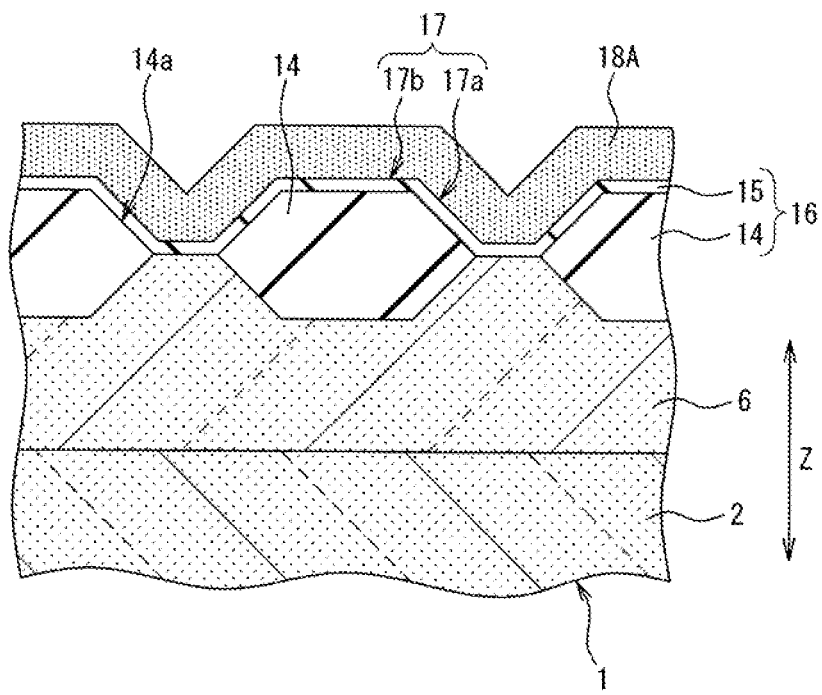
FIG. 14 is a diagram for illustrating the method of manufacturing the semiconductor device according to the first embodiment of the invention, and is a sectional view in a position corresponding to the line IIc-IIc of FIG. 1.

Next, as shown in FIGS. 13A, 13B, and 14, the thin film semiconductor layer 18A which oscillates (meanders) cyclically in the thickness direction of the semiconductor substrate 1 is formed on the insulating film 16 so as to reflect the undulations 17 of the insulating film 16. The thin film semiconductor layer 18A is formed by forming a non-doped polysilicon film on the insulating film 16 using, for example, a CVD method, subsequently, implanting, for example, boron (B) ions or boron difluoride ($BF_2$) ions as impurity ions into the non-doped polysilicon film so that the surface concentration is, for example, on the order of $1 \times 10^{17}/cm^3$ to $1 \times 10^{20}/cm^3$, and subsequently, performing heat treatment. The thin film semiconductor layer 18A is formed to a film thickness of, for example, on the order of 0.2 μm.

Figure 15A:
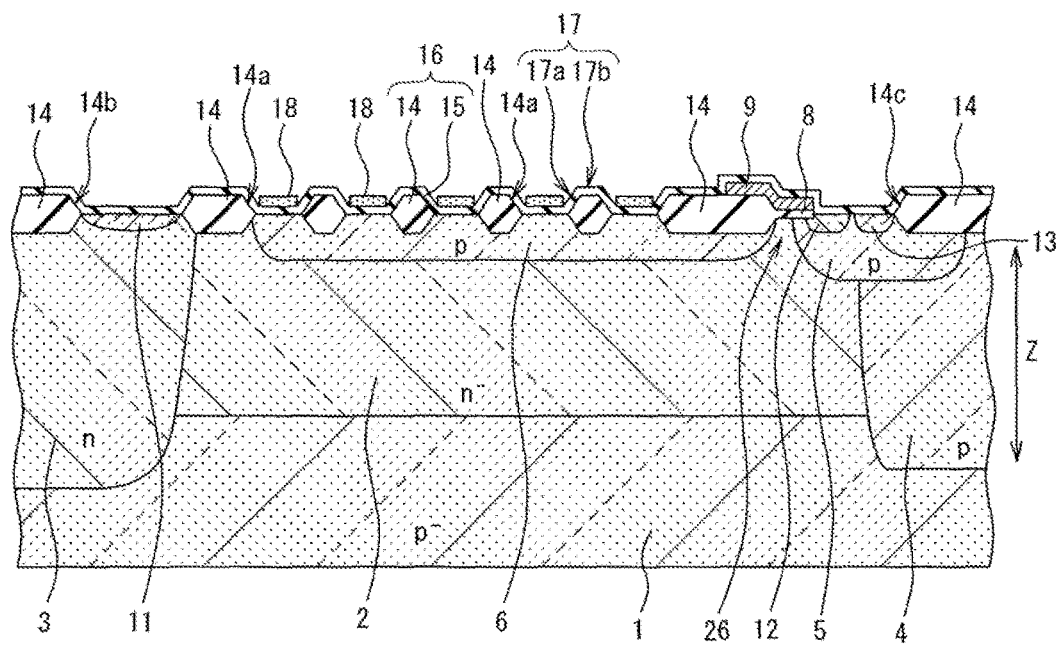
Figure 15B:
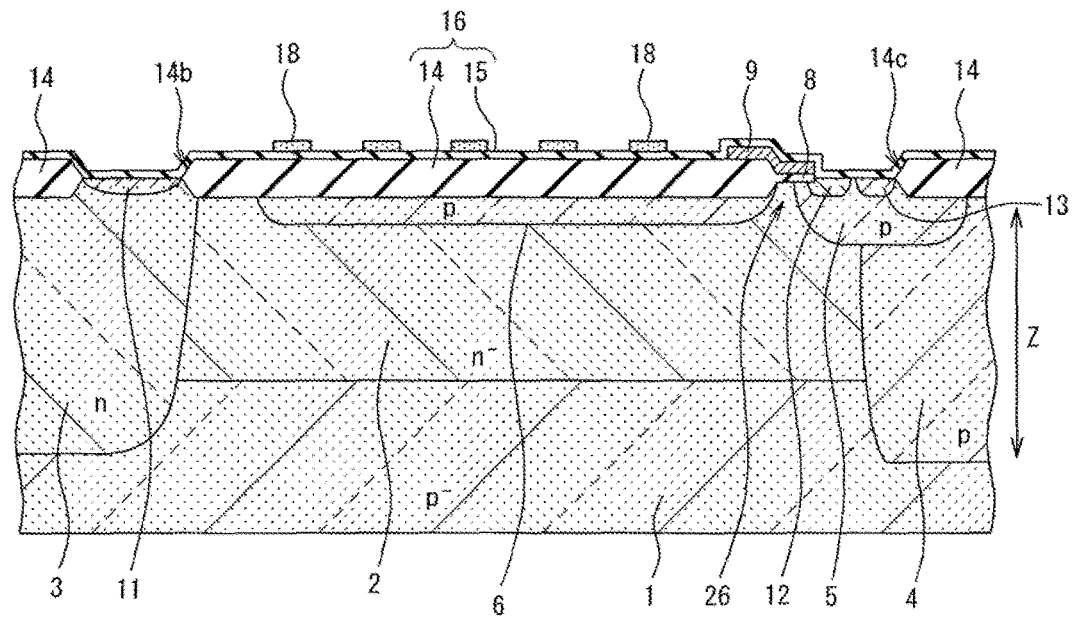

Next, the thin film semiconductor layer 18A is selectively etched using a photolithography technology, a dry etching technology, or the like, thus forming the spiral pattern of the thin film resistance layer 18 on a thin film resistance layer formation region of the insulating film 16 on the breakdown voltage region (offset region 2) of the high voltage MOSFET 26, as shown in FIGS. 15A, 15B, and 1. The thin film resistance layer 18 is formed so that one end side thereof overlaps a first main electrode terminal formation region of the first main electrode terminal 21 and the other end side thereof overlaps a second main electrode terminal formation region of the second main electrode terminal 22.

Next, as shown in FIGS. 2A and 2B, the interlayer insulating film 20 formed of a silicon oxide film is formed all over on the principal surface of the semiconductor substrate 1, including on the thin film resistance layer 18, by, for example, a CVD method. The thin film resistance layer 18 is covered with the interlayer insulating film 20.

Next, as shown in FIGS. 2A and 2B, the contact hole 20a reaching the first main electrode region 11 of the principal surface of the semiconductor substrate 1 from the front surface of the interlayer insulating film 20, and the contact hole 20b reaching the second main electrode region 12, are formed using a photolithography technology, a dry etching technology, or the like. At this time, the contact holes 20c reaching one end side connection portion of the thin film resistance layer 18 from the front surface of the interlayer insulating film 20, and the contact holes 20d reaching the other end side connection portion of the thin film resistance layer 18, are formed in the positions shown in FIG. 1 so as to pass through the interlayer insulating film 20.

Next, a metal film, such as an Al film or an Al alloy film, is formed all over on the interlayer insulating film 20, including in the contact holes 20a to 20d, by sputter deposition or the like. Subsequently, the metal film is selectively etched by a photolithography technology, a dry etching technology, or the like, thus forming the pattern of the first main electrode terminal 21 in the first main electrode terminal formation region and the pattern of the second main electrode terminal 22 in the second main electrode terminal formation region, as shown in FIGS. 1, 2A, and 2B. The first main electrode terminal 21 and the second main electrode terminal 22 are each formed in a frame shape in such a way as to surround the circuit formation region 1A of the principal surface of the semiconductor substrate 1. Also, the first main electrode terminal 21 is positioned inside the second main electrode terminal 22 and mutually spaced from the second main electrode terminal 22. Also, the first main electrode terminal 21 is electrically and metallurgically connected to the first main electrode region (drain region) 11 through the contact hole 20a and to the one end side connection portion of the thin film resistance layer 18 through the contact holes 20c. Also, the second main electrode terminal 22 is electrically and metallurgically connected to the second main electrode region (source region) 12 though the contact hole 20b and to the other end side connection portion of the thin film resistance layer 18 through the contact holes 20d.

Next, the protection film 23 formed of, for example, a polyimide insulating resin is formed all over on the interlayer insulating film 20 in such a way as to cover the first main electrode terminal 21 and second main electrode terminal 22, and a rear surface electrode or the like is formed on a rear surface on the side opposite from the principal surface of the semiconductor substrate 1, thereby completing the wafer process of the semiconductor device 30A according to the first embodiment of the invention shown in FIGS. 1 to 3B.

As heretofore described, the thin film resistance layer 18 is formed in a topology in which it oscillates up and down cyclically along the undulations 17 of the insulating film 16 so as to reflect the undulations 17 of the insulating film 16. Further, the undulations 17 of the insulating film 16 are formed by the presence or absence of the first insulating film 14, in other words, the presence or absence of the depression window portions 14a of the first insulating film 14. Furthermore, the insulating film 16 is interposed between the breakdown voltage region of the high voltage MOSFET 26 and the thin film resistance layer 18 acting as a field plate, and in general, it is easy to selectively form the insulating film 16 on the principal surface of the semiconductor substrate 1, as a field insulating film which insulates and separates the breakdown voltage region from the thin film resistance layer 18, using a selective oxidation method. With the semiconductor device 30A according to the first embodiment, as the undulations of the insulating film 16 is easily formed using a selective oxidation method, it is possible, by changing the pattern of the oxidation resistant mask formed of a silicon nitride film, to easily form the undulations 17 of the insulating film 16, which are reflected on the thin film resistance layer 18, without increasing manufacturing process man-hours.

Second Embodiment

A description has been given of the case in which the semiconductor device 30A according to the first embodiment includes the high voltage MOSFET 26 as a high voltage active element to which a field plate effect is applied, as shown in FIGS. 2A and 2B. As opposed to this, a semiconductor device 30B according to a second embodiment of the invention includes a high voltage diode 27 as a high voltage active element to which a field plate effect is applied, as shown in FIGS. 16A and 16B.

Figure 16A:
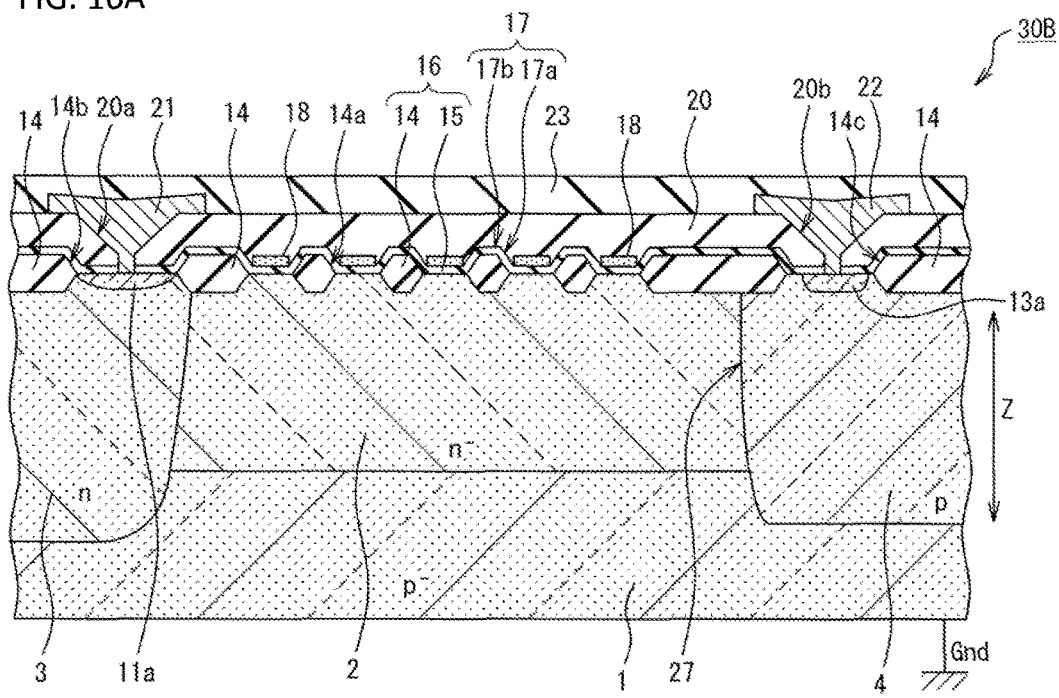
Figure 16B:
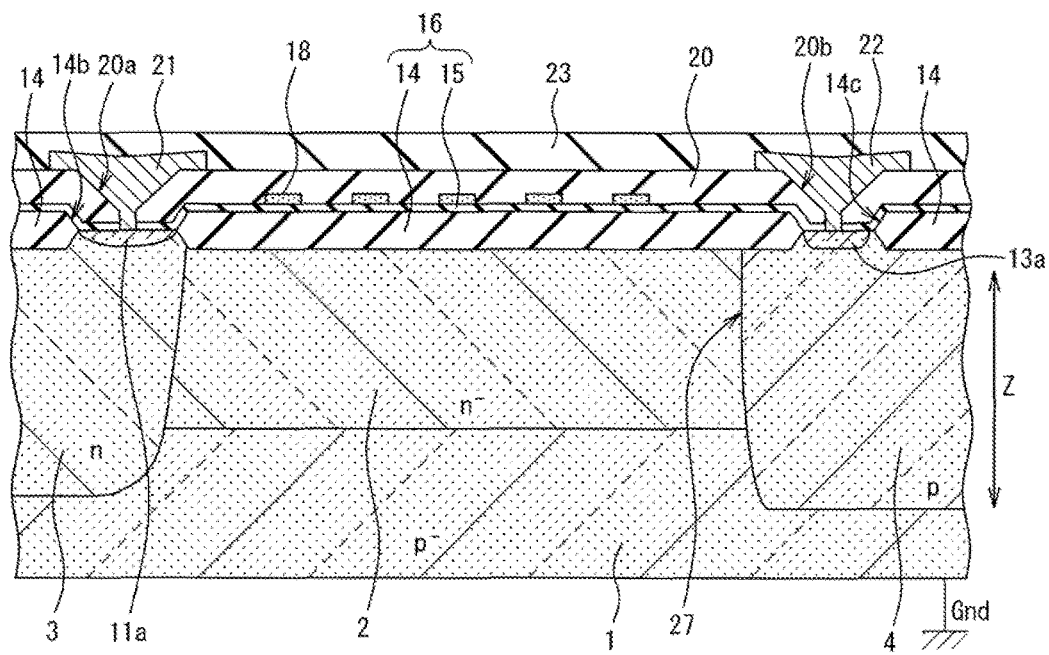

As shown in FIGS. 16A and 16B, the semiconductor device 30B according to the second embodiment includes the semiconductor substrate 1, the first main electrode terminal 21 disposed on the principal surface of the semiconductor substrate 1, and the second main electrode terminal 22 disposed, away from the first main electrode terminal 21, in a position on the principal surface of the semiconductor substrate 1 which surrounds the first main electrode terminal 21. Also, the semiconductor device 30B according to the second embodiment includes the insulating film 16 formed on the principal surface of the semiconductor substrate 1 between the first main electrode terminal 21 and the second main electrode terminal 22, the thin film resistance layer 18 which is a resistive field plate, and the high voltage diode 27 acting as a high voltage active element. The thin film resistance layer 18, one end side of which is connected to the first main electrode terminal 21 and the other end side of which is connected to the second main electrode terminal 22, is formed in a spiral circle shape, in such a way as to surround the first main electrode terminal 21, on the insulating film 16 between the first main electrode terminal 21 and the second main electrode terminal 22. Further, the thin film resistance layer 18 circles while meandering (oscillating) in the thickness direction of the semiconductor substrate 1.

The high voltage diode 27 is formed on the principal surface of the semiconductor substrate 1 between the first main electrode terminal 21 and the second main electrode terminal 22. The high voltage diode 27 has a second conductivity type ($n^+$-type) first main electrode region 11a acting as a cathode region disposed in an upper portion of the n-type well region 3 (or offset region 2) in the inner portion of the first main electrode region window portion 14b of the first insulating film 14, and a first conductivity type ($p^+$-type) second main electrode region 13a acting as an anode region disposed, away from the $n^-$-type offset region 2, in an upper portion of the p-type well region 4 in the inner portion of the second main electrode region window portion 14c of the first insulating film 14. The first main electrode region 11a is annularly formed along the plane pattern of the first main electrode terminal 21, in the same way as the first main electrode region 11 according to the first embodiment, and the second main electrode region 13a is annularly formed along the plane pattern of the second main electrode terminal 22, in the same way as the pickup region 13 according to the first embodiment.

In the semiconductor device 30B according to the second embodiment, the thin film resistance layer 18 which is a field plate is disposed on the breakdown voltage region of the high voltage diode 27 on the principal surface of the semiconductor substrate 1 with the insulating film 16 interposed therebetween. In the semiconductor device 30B according to the second embodiment, the undulations 17 of the front surface of the insulating film 16 are formed by the presence or absence of the first insulating film 14, in other words, the presence or absence of the depression window portions 14a, and the thin film resistance layer 18 is spirally formed along the undulations 17 of the insulating film 16 so as to reflect the undulations 17 of the front surface of the insulating film 16, in the same way as in the semiconductor device 30A according to the first embodiment.

Consequently, in the semiconductor device 30B according to the second embodiment configured in this way, it is possible to achieve a reduction in power consumption when on standby, in the same way as in the semiconductor device 30A according to the first embodiment.

Third Embodiment

A semiconductor device 30C according to a third embodiment of the invention has substantially the same configuration as the semiconductor device 30A according to the first embodiment, but the shape of depressions (the depression window portions of the second insulating film 15) configuring the undulations 17 of the insulating film 16 is different.

As shown in FIGS. 17, 18A, 18B, 19, and the like, the semiconductor device 30C according to the third embodiment includes the semiconductor substrate 1, the first main electrode terminal 21 disposed on the principal surface of the semiconductor substrate 1, and the second main electrode terminal 22 disposed, away from the first main electrode terminal 21, in a position on the principal surface of the semiconductor substrate 1 which surrounds the first main electrode terminal 21. Also, the semiconductor device 30C according to the third embodiment includes the insulating film formed on the principal surface of the semiconductor substrate 1 between the first main electrode terminal 21 and the second main electrode terminal 22, the thin film resistance layer 18 which is a resistive field plate, and the high voltage MOSFET 26 acting as a high voltage active element. The thin film resistance layer 18, one end side of which is connected to the first main electrode terminal 21 and the other end side of which is connected to the second main electrode terminal 22, is formed in a spiral circle shape, in such a way as to surround the first main electrode terminal 21, on the insulating film 16 between the first main electrode terminal 21 and the second main electrode terminal 22. Further, the thin film resistance layer 18 circles while oscillating (meandering) in the thickness direction of the semiconductor substrate 1. The high voltage MOSFET 26 is formed on the principal surface of the semiconductor substrate 1 between the first main electrode terminal 21 and the second main electrode terminal 22.

In the semiconductor device 30A according to the first embodiment, the depressions 17a configuring the undulations 17 of the insulating film 16, in other words, the depression window portions 14a of the first insulating film 14 are disposed, underneath the thin film resistance layer 18, as a cyclic dot pattern in the circling direction of the thin film resistance layer 18, as shown in FIGS. 1 to 3B. As opposed to this, in the semiconductor device 30C according to the third embodiment, depressions 17a1 configuring the undulations 17 of the insulating film 16, in other words, depression window portions 14a1 of the first insulating film 14 extend along on the imaginary lines connecting the first main electrode terminal 21 and second main electrode terminal 22 in such a way as to cross the thin film resistance layer 18, and are cyclically disposed in the circling direction of the thin film resistance layer 18. The depressions 17a1 of the insulating film 16 (the depression window portions 14a1 of the first insulating film 14) according to the third embodiment can be easily changed in shape simply by changing the pattern of an oxidation resistant mask formed of, for example, a silicon nitride film used when forming the first insulating film 14 using a selective oxidation method.

In the semiconductor device 30C according to the third embodiment, the undulations 17 of the front surface of the insulating film 16 are formed by the presence or absence of the first insulating film 14, in other words, the presence or absence of the depression window portions 14a1 of the first insulating film 14, and the thin film resistance layer 18 is spirally formed along the undulations 17 of the insulating film 16 so as to reflect the undulations 17 of the front surface of the insulating film 16, in the same way as in the semiconductor device 30A according to the first embodiment.

Consequently, in the semiconductor device 30C according to the third embodiment configured in this way, it is possible to achieve a reduction in power consumption when on standby, in the same way as in the semiconductor device 30A according to the first embodiment.

Figure 17:
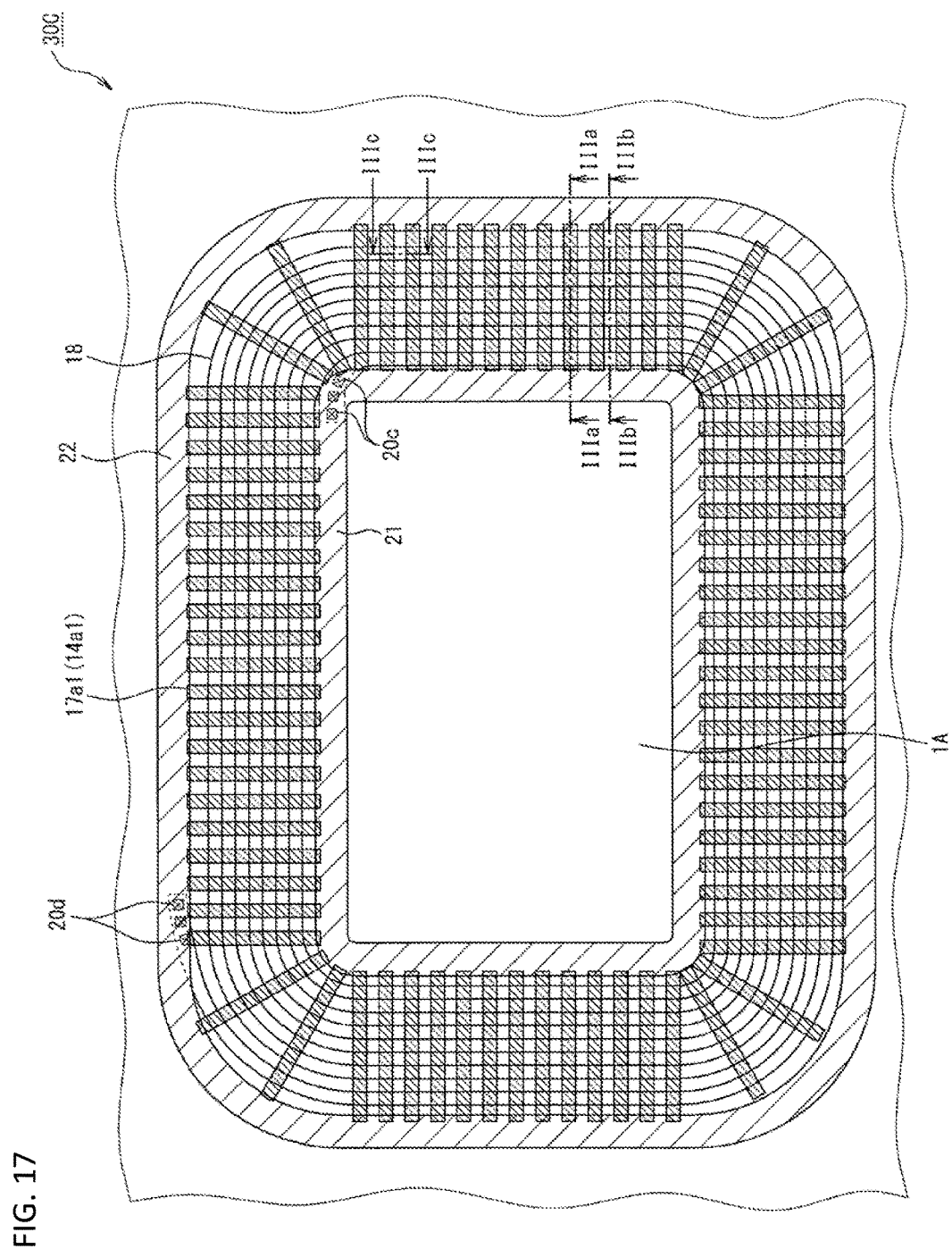
FIG. 17 is a main portion plan view showing an outline configuration of a semiconductor device according to a third embodiment of the invention.

As the cyclic nature of the depressions 17a1 of the insulating film 16 (the depression window portions 14a1 of the first insulating film 14) is impaired in the corner portions of the first main electrode terminal 21, that is, the curved portions of the thin film resistance layer 18 compared with in the straight portions of the thin film resistance layer 18, as shown in FIG. 17, the effective length of the thin film resistance layer 18 decreases compared with in the first embodiment of the invention.

Fourth Embodiment

A semiconductor device 30D according to a fourth embodiment of the invention has substantially the same configuration as the semiconductor device 30C according to the third embodiment of the invention, but a high voltage active element to which a field plate effect is applied is different.

Figure 20A:
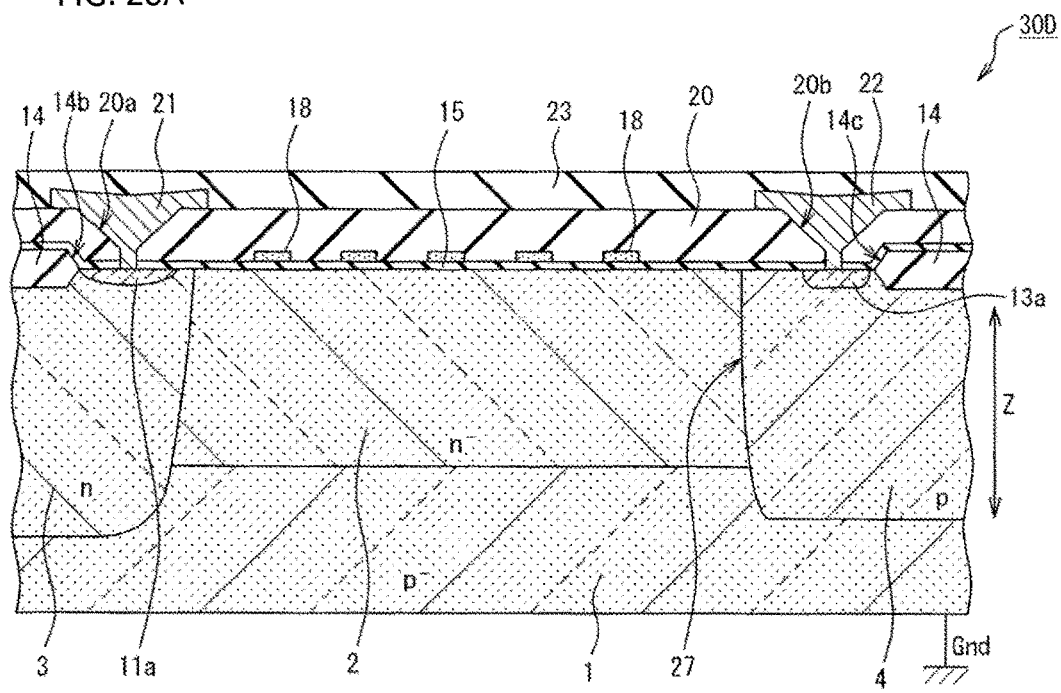
Figure 20B:
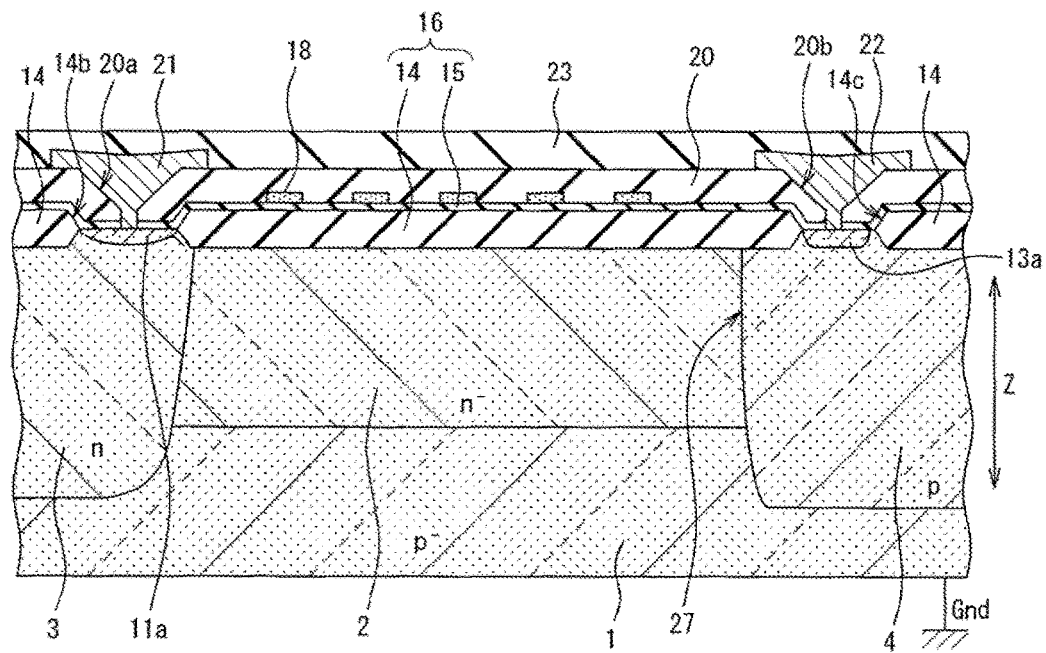

As shown in FIGS. 20A and 20B, the semiconductor device 30D according to the fourth embodiment includes the semiconductor substrate 1, the first main electrode terminal 21 disposed on the principal surface of the semiconductor substrate 1, and the second main electrode terminal 22 disposed, away from the first main electrode terminal 21, in a position on the principal surface of the semiconductor substrate 1 which surrounds the first main electrode terminal 21. Also, the semiconductor device 30D according to the fourth embodiment includes the insulating film 16 formed on the principal surface of the semiconductor substrate 1 between the first main electrode terminal 21 and the second main electrode terminal 22, the thin film resistance layer 18 which is a resistive field plate, and the high voltage diode 27 acting as a high voltage active element. The thin film resistance layer 18, one end side of which is connected to the first main electrode terminal 21 and the other end side of which is connected to the second main electrode terminal 22, is formed in a spiral circle shape, in such a way as to surround the first main electrode terminal 21, on the insulating film 16 between the first main electrode terminal 21 and the second main electrode terminal 22. Further, the thin film resistance layer 18 circles spirally while oscillating (meandering) in the thickness direction of the semiconductor substrate 1. The high voltage diode 27 is formed on the principal surface of the semiconductor substrate 1 between the first main electrode terminal 21 and the second main electrode terminal 22.

Figure 18A:
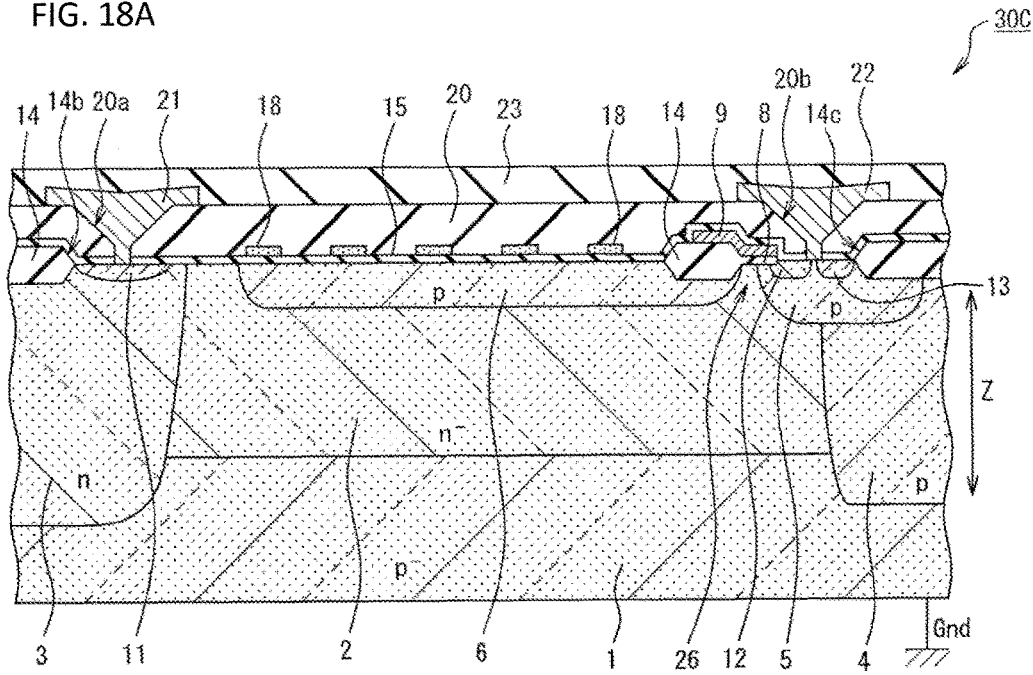
Figure 18B:
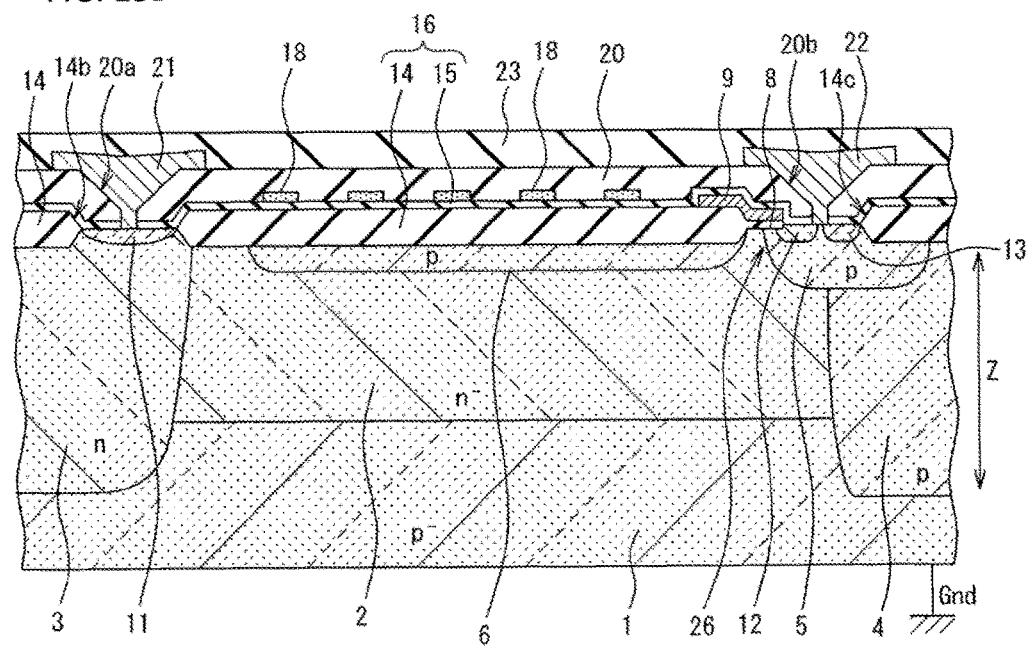
Figure 19:
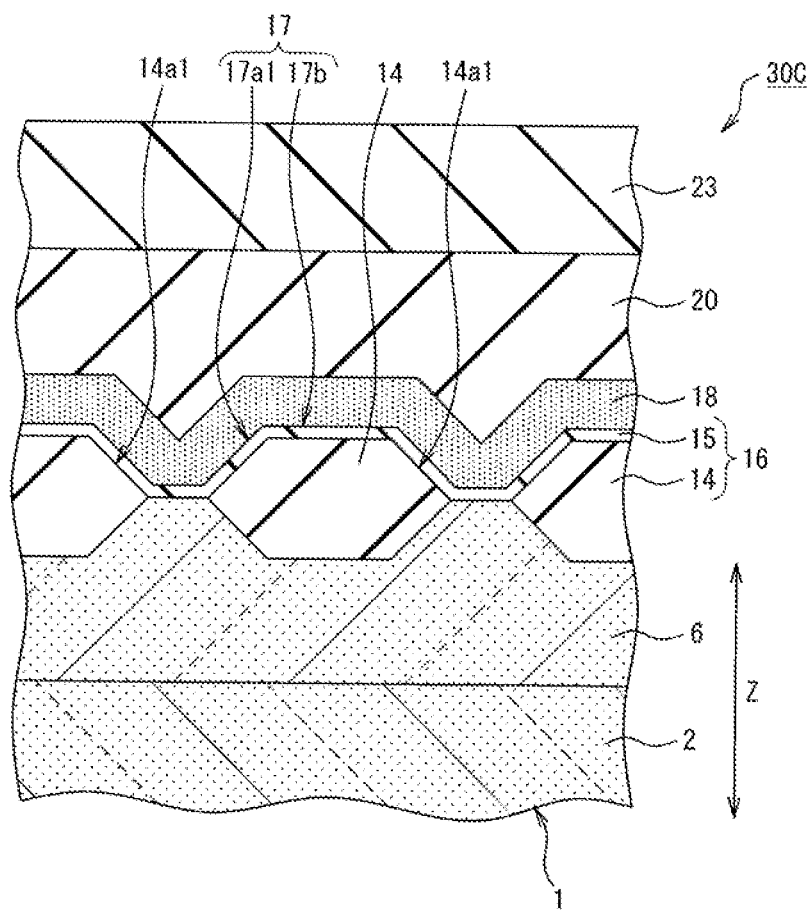
FIG. 19 is a sectional view showing a sectional structure along the line IIIc-IIIc of FIG. 17.

A description has been given of the case in which the semiconductor device 30C according to the third embodiment includes the high voltage MOSFET 26 acting as a high voltage active element to which a field plate effect is applied, as shown in FIGS. 18A and 18B. As opposed to this, the semiconductor device 30D according to the fourth embodiment includes the high voltage diode 27 acting as a high voltage active element to which a field plate effect is applied, as shown in FIGS. 20A and 20B. The high voltage diode 27 has the same configuration as the high voltage diode 27 shown in FIGS. 16A and 16B.

In the semiconductor device 30D according to the fourth embodiment, the thin film resistance layer 18 which is a field plate is disposed on the breakdown voltage region of the high voltage diode 27 on the principal surface of the semiconductor substrate 1 with the insulating film 16 interposed therebetween. In the semiconductor device 30D according to the fourth embodiment, the undulations 17 of the front surface of the insulating film 16 are formed by the presence or absence of the first insulating film 14, in other words, the presence or absence of the depression window portions 14a1, and the thin film resistance layer 18 is spirally formed along the undulations 17 of the insulating film 16 so as to reflect the undulations 17 of the front surface of the insulating film 16, in the same way as in the semiconductor device 30C according to the third embodiment.

Consequently, in the semiconductor device 30D according to the fourth embodiment configured in this way, it is possible to achieve a reduction in power consumption when on standby, in the same way as in the semiconductor device 30A according to the first embodiment.

Fifth Embodiment

A semiconductor device 30E according to a fifth embodiment of the invention has substantially the same configuration as the semiconductor device 30C according to the third embodiment, but the shape of depressions (depression window portions of the first insulating film 14) configuring the undulations of the insulating film 16 is different.

That is, to give a description referring to FIGS. 18A and 18B, the semiconductor device 30E according to the fifth embodiment includes the first main electrode terminal 21 disposed on the principal surface of the semiconductor substrate 1, and the second main electrode terminal 22 disposed, away from the first main electrode terminal 21, in a position on the principal surface of the semiconductor substrate 1 which surrounds the first main electrode terminal 21, in the same way as the semiconductor device 30C according to the third embodiment. Also, the semiconductor device 30E according to the fifth embodiment includes the insulating film 16 formed on the principal surface of the semiconductor substrate 1 between the first main electrode terminal 21 and the second main electrode terminal 22, and the thin film resistance layer 18 acting as a field plate. The thin film resistance layer 18, one end side of which is connected to the first main electrode terminal 21 and the other end side of which is connected to the second main electrode terminal 22, is formed on the insulating film 16 in a spiral circle shape in such a way as to surround the first main electrode terminal 21. Further, the thin film resistance layer 18 circles spirally while oscillating (meandering) in the thickness direction of the semiconductor substrate 1.

Figure 21:
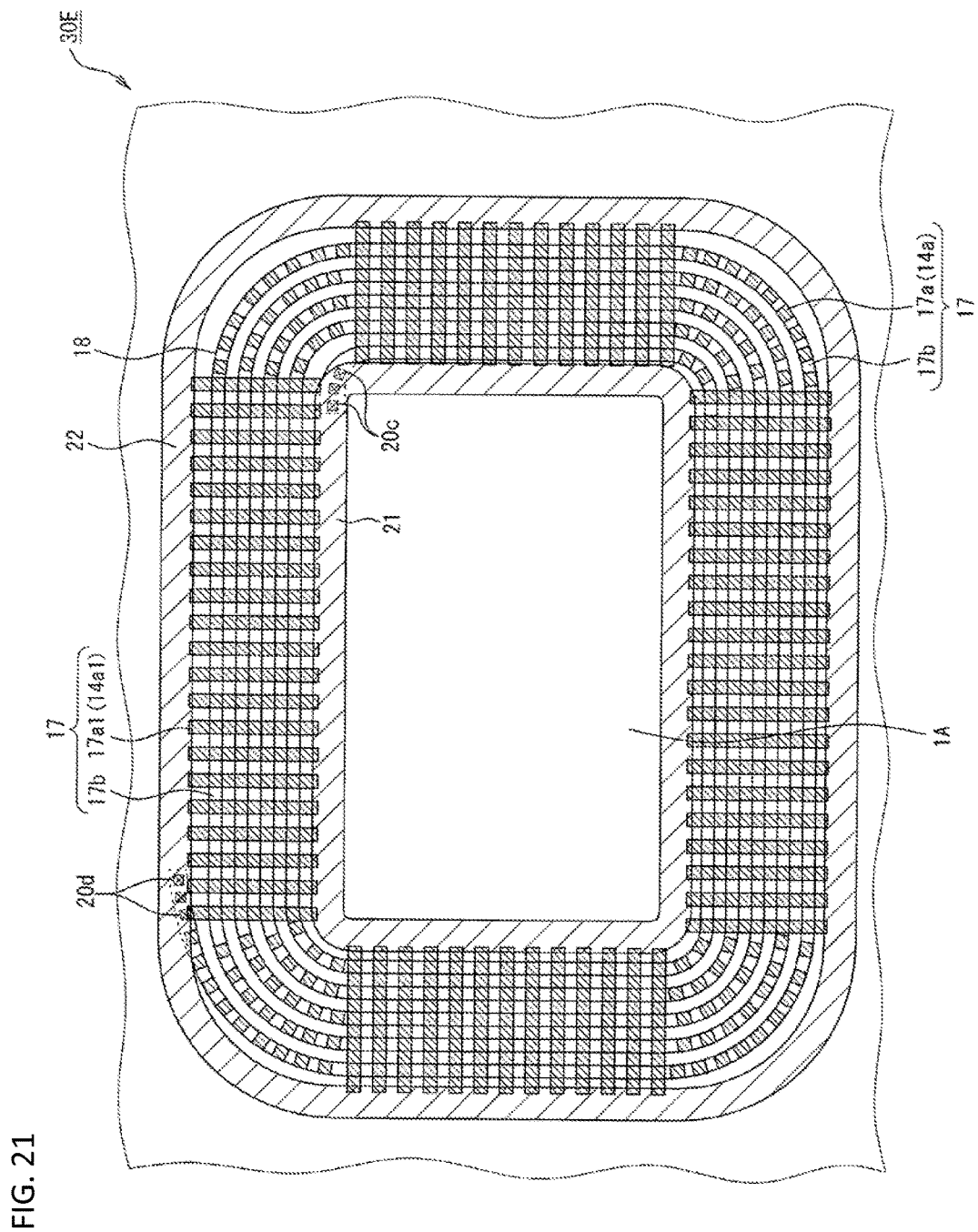
FIG. 21 is a main portion plan view showing an outline structure of a semiconductor device according to a fifth embodiment of the invention.

As shown in FIG. 21, the semiconductor device 30E according to the fifth embodiment of the invention is such that in the straight portions of the first main electrode terminal 21, in other words, the straight portions of the thin film resistance layer 18, the depressions 17a1 configuring the undulations 17 of the insulating film 16 (the depression window portions 14a1 of the first insulating film 14) extend along on the imaginary lines connecting the first main electrode terminal 21 and second main electrode terminal 22 in such a way as to cross the thin film resistance layer 18, and are cyclically disposed in the extension direction of the thin film resistance layer 18. Further, in the corner portions of the first main electrode terminal 21, in other words, the curved portions of the thin film resistance layer 18, the depressions 17a configuring the undulations 17 of the insulating film 16 (the depression window portions 14a of the first insulating film 14) are disposed, underneath the thin film resistance layer 18, as a cyclic dot pattern in the circling direction of the thin film resistance layer 18, in the same way as in the semiconductor devices 30A and 30B according to the first and second embodiments of the invention.

That is, the semiconductor device 30E according to the fifth embodiment of the invention has a configuration wherein the depressions 17a of the insulating film 16 (the depression window portions 14a of the first insulating film 14) according to the first embodiment of the invention and the depressions 17a1 of the insulating film 16 (the depression window portions 14a1 of the first insulating film 14) according to the third embodiment of the invention are combined.

Consequently, in the semiconductor device 30E according to the fifth embodiment of the invention configured in this way, too, it is possible to achieve a reduction in power consumption when on standby, in the same way as in the semiconductor devices 30A and 30B according to the first and second embodiments of the invention.

Sixth Embodiment

A semiconductor device 30F according to a sixth embodiment of the invention has substantially the same configuration as the semiconductor device 30A according to the first embodiment, but the configuration of undulations 17 of the insulating film 16 interposed between the high voltage MOSFET 26 which is a high voltage active element and the thin film resistance layer 18 which is a field plate is different.

The semiconductor device 30A according to the first embodiment is such that the undulations 17 of the front surface of the insulating film 16 are formed by the presence or absence of the first insulating film 14, in other words, the presence or absence of the depression window portions 14a, as shown in FIGS. 2A, 2B, 3A, and 3B. As opposed to this, the semiconductor device 30F according to the sixth embodiment of the invention is such that the undulations 17 of the front surface of the insulating film 16 are formed by providing grooves 15a in the front surface of the second insulating film 15, as shown in FIGS. 22A, 22B, and 23.

Figure 22A:
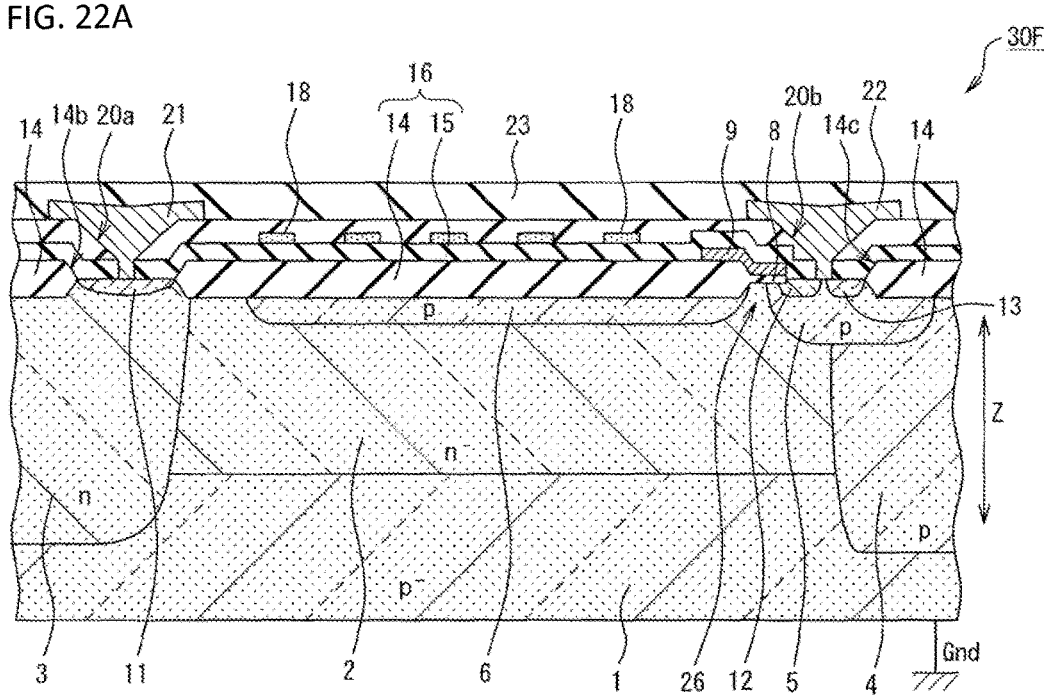
Figure 22B:
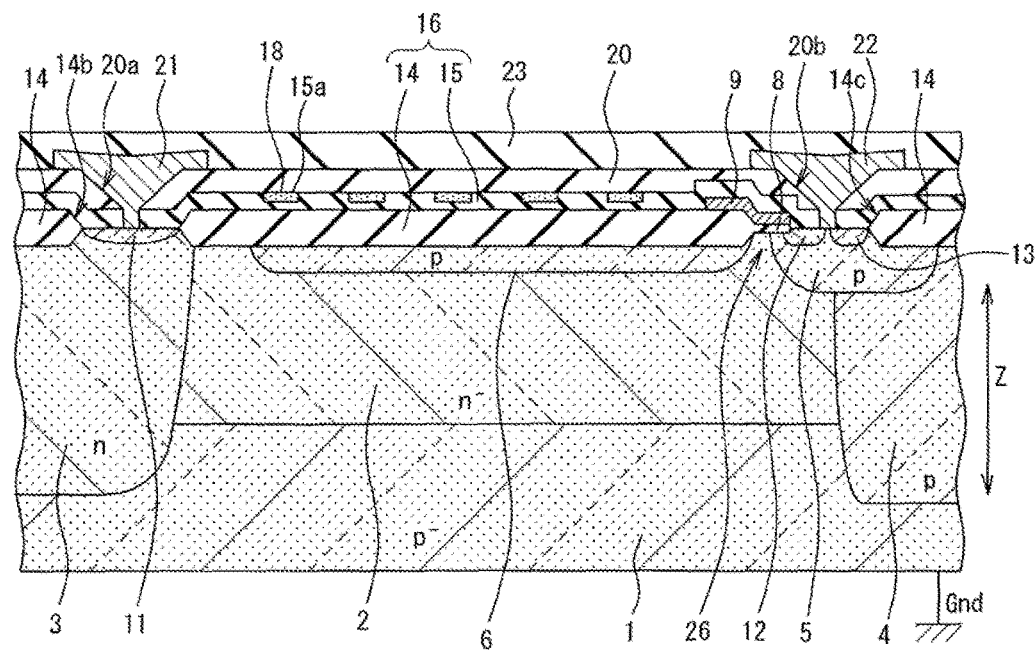
Figure 23:
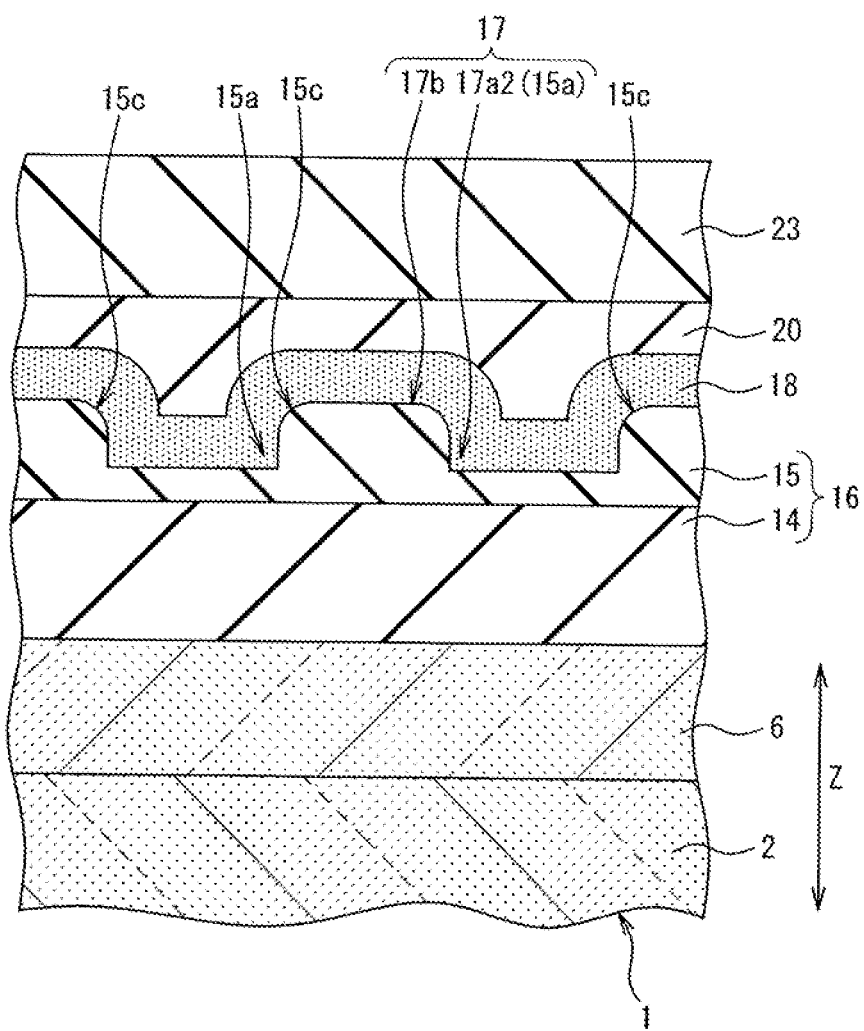
FIG. 23 is a diagram showing an outline configuration of the semiconductor device according to the sixth embodiment of the invention, and is a sectional view showing a sectional structure in a position corresponding to the line IIc-IIc of FIG. 1.

As shown in FIGS. 22A, 22B, and 23, the semiconductor device 30F according to the sixth embodiment includes the first main electrode terminal 21 disposed on the principal surface of the semiconductor substrate 1, and the second main electrode terminal 22 disposed, away from the first main electrode terminal 21, in a position on the principal surface of the semiconductor substrate 1 which surrounds the first main electrode terminal 21, in the same way as the semiconductor device 30A according to the first embodiment. Also, the semiconductor device 30F according to the sixth embodiment includes the insulating film 16 formed on the principal surface of the semiconductor substrate 1 between the first main electrode terminal 21 and the second main electrode terminal 22, and the thin film resistance layer 18 acting as a field plate. The thin film resistance layer 18, one end side of which is connected to the first main electrode terminal 21 and the other end side of which is connected to the second main electrode terminal 22, is formed on the insulating film 16 in a spiral circle shape in such a way as to surround the first main electrode terminal 21. Further, the thin film resistance layer 18 circles spirally while oscillating (meandering) in the thickness direction of the semiconductor substrate 1.

Depressions 17a2 configuring the undulations 17 of the insulating film 16 are formed by the grooves 15a provided in the second insulating film 15, and the projections 17b are formed by the second insulating film 15 around the grooves 15a. In the sixth embodiment, the depressions 17a2 of the insulating film 16 (the grooves 15a of the second insulating film 15) are disposed, underneath the thin film resistance layer 18, as a cyclic dot pattern in the circling direction of the thin film resistance layer 18, in the same way as the depressions 17a of the insulating film 16 (the depression window portions 14a of the first insulating film 14) according to the first embodiment. Consequently, the thin film resistance layer 18 shows a cyclic serpentine pattern going up and down in a saw-toothed form with the undulations 17 of the insulating film in the thickness direction (Z direction) of the semiconductor substrate 1, as shown in the sectional view of FIG. 23, while the thin film resistance layer 18 has a topology in which it circles spirally so as to surround the first main electrode terminal 21 in the planar direction of the semiconductor substrate 1, as shown in the plan view of FIG. 1.

Upper edge portions 15c of the grooves 15a of the second insulating film 15 (the corner portions in each of which the front surface of the second insulating film meets the side surface of the inner portion of the groove) are gently rounded, as shown in FIG. 23, thus suppressing a deterioration in the step coverage of the thin film semiconductor layer 18A (refer to FIG. 32) when forming the thin film resistance layer 18.

Method of Manufacturing Semiconductor Device According to Sixth Embodiment

Next, a description will be given, using FIGS. 24A to 32, of a method of manufacturing the semiconductor device 30F according to the sixth embodiment, but as the method is substantially the same as the method of manufacturing the semiconductor device 30A according to the first embodiment except the step of forming the insulating film 16, a description will be given specializing in the step of forming the insulating film 16, and a detailed description of other steps will be omitted.

Figure 24A:
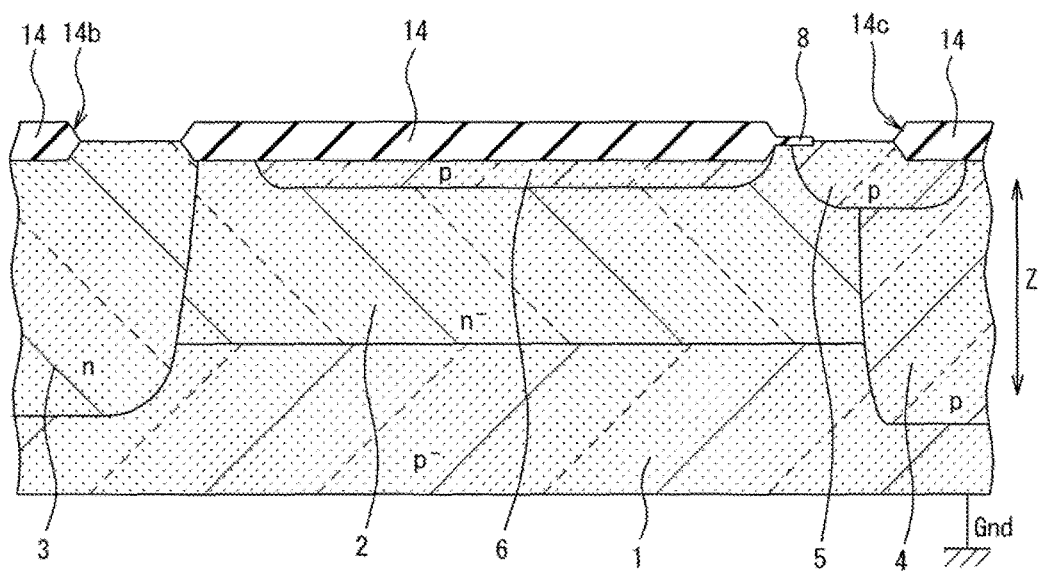
Figure 24B:
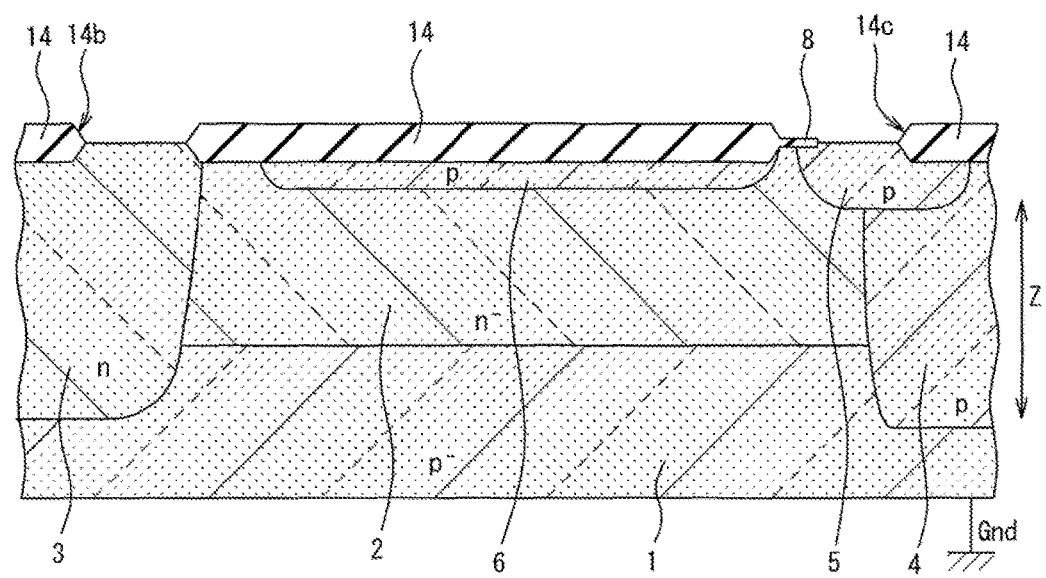

Firstly, the p⁻-type semiconductor substrate 1 is prepared, and subsequently, the same steps as in the first embodiment are performed, thus forming the n⁻-type offset region 2, the n-type well region 3, the p-type well region 4, the p-type channel formation region 5, the p-type offset region 6, and the like, as shown in FIGS. 24A and 24B.

Next, a silicon nitride ($Si_3N_4$) film is deposited as an oxidation resistant film on the principal surface of the semiconductor substrate 1, and the silicon nitride film is patterned using a photolithography technology, thus forming an oxidation resistant mask. Further, the principal surface of the semiconductor substrate 1 is selectively oxidized by a selective oxidation method using the oxidation resistant mask, thus forming the first insulating film (selective oxide film) 14 formed of a silicon oxide film. Subsequently, when the oxidation resistant mask is removed, the pattern of the first insulating film 14 is formed in the non-active region in which no transistor, including the high voltage MOSFET 26, is formed, as shown in FIGS. 24A and 24B. The first insulating film 14 according to the sixth embodiment has the first main electrode region window portion 14b and second main electrode region window portion 14c, in the same way as the insulating film 14 according to the first embodiment, but the depression window portions 14a are not formed. That is, the first insulating film 14 on the breakdown voltage region (offset region 2) of the principal surface of the semiconductor substrate 1 is flat.

Figure 25A:
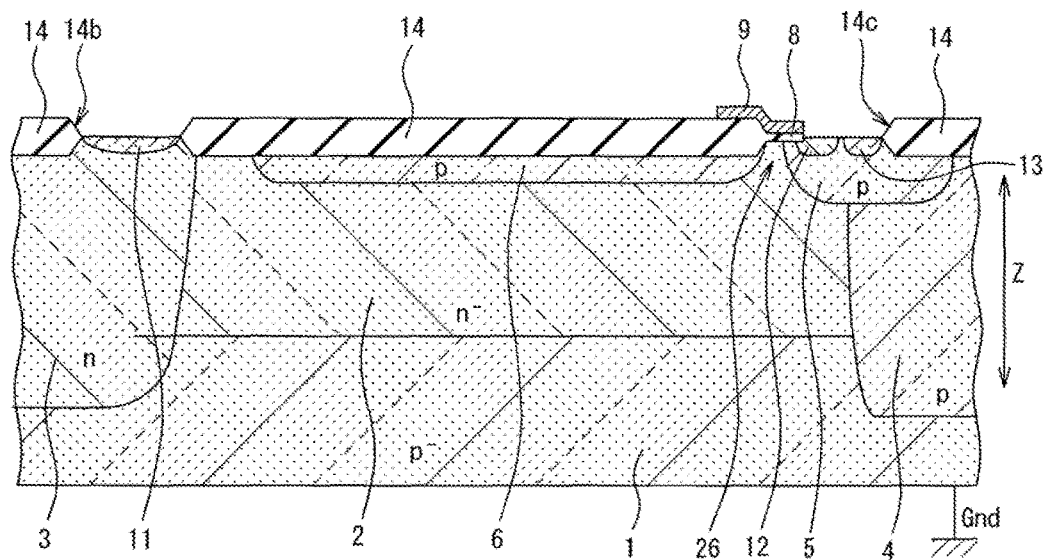
Figure 25B:
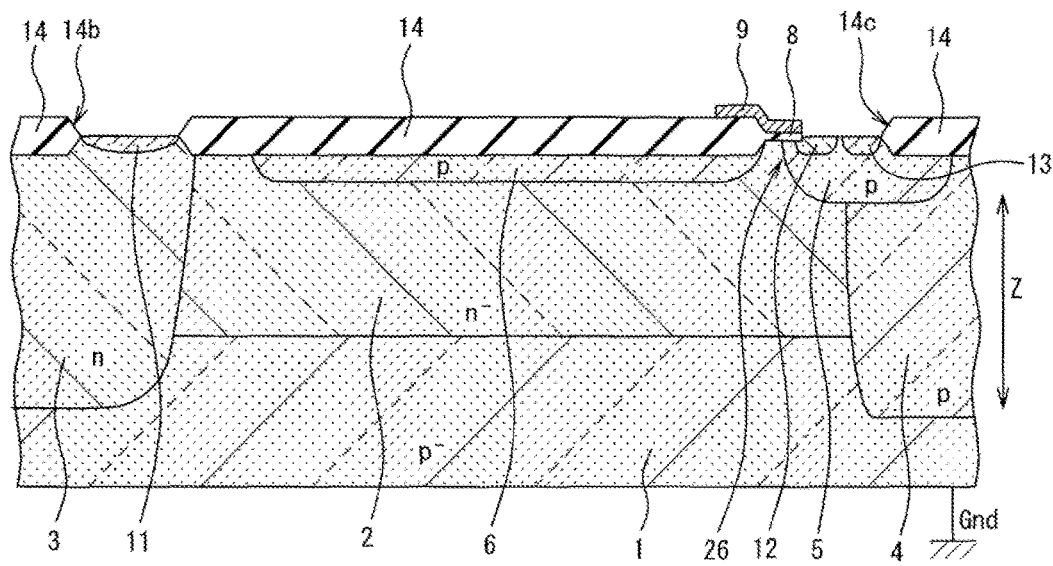

Next, the same steps as in the first embodiment of the invention are performed, thus forming the gate insulating film 8, the gate electrode 9, the first main electrode region (drain region) 11, the second main electrode region (source region) 12, the pickup region 13, and the like, as shown in FIGS. 25A and 25B.

Figure 26A:
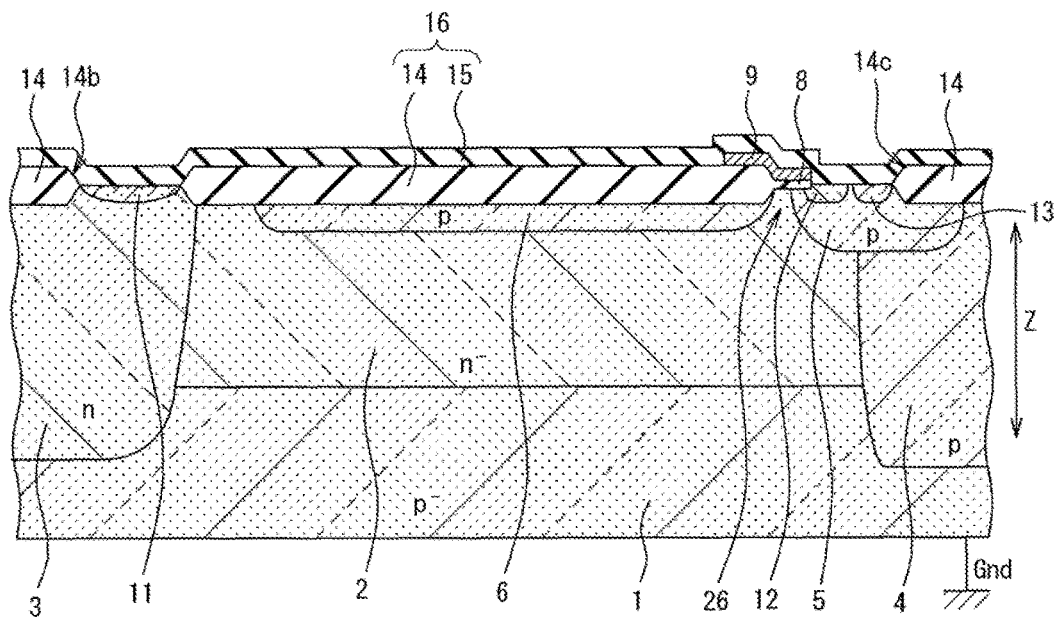
Figure 26B:
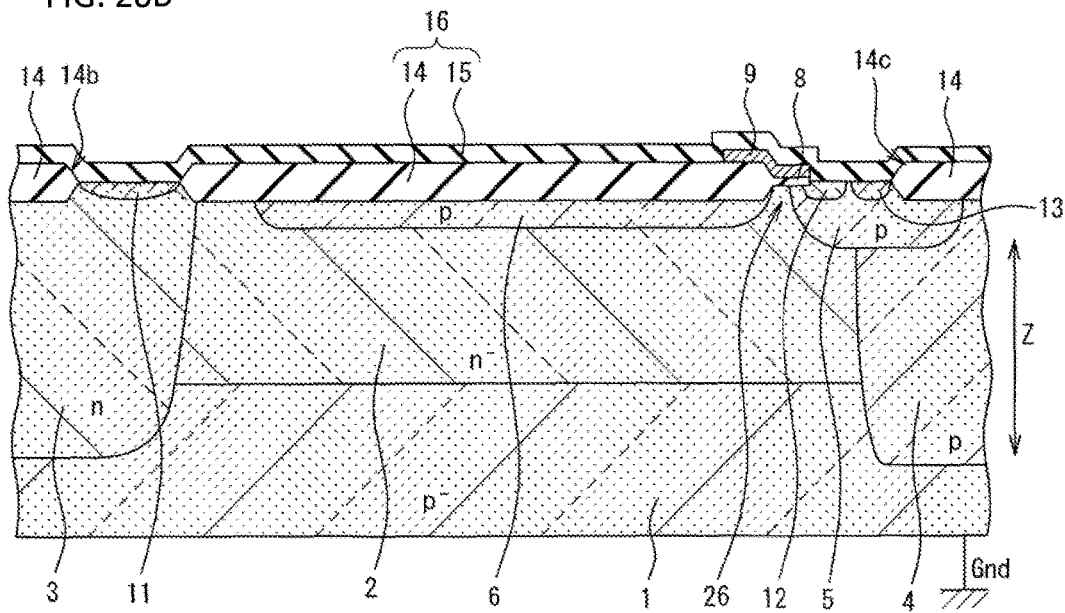
Figure 27:
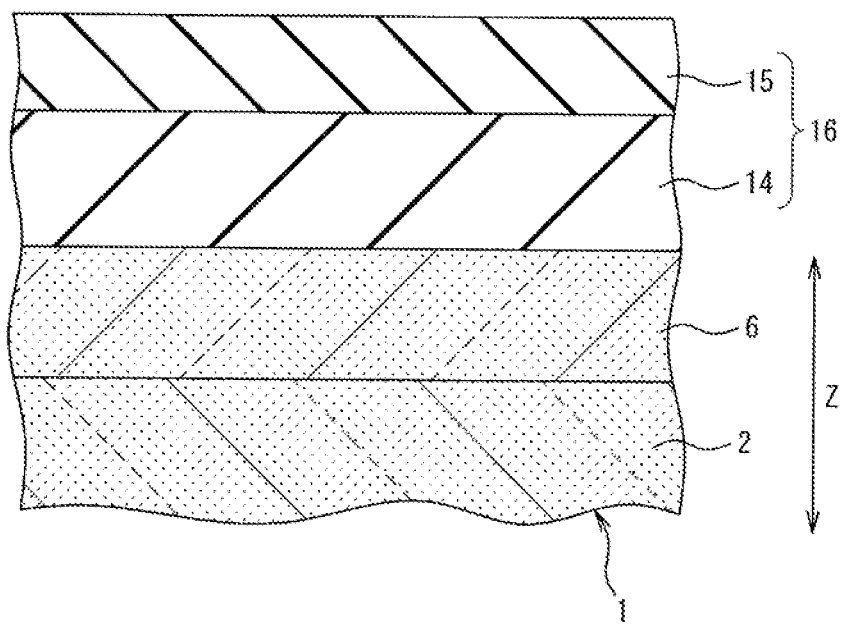
FIG. 27 is a diagram for illustrating the method of manufacturing the semiconductor device according to the sixth embodiment of the invention, and is a sectional view in a position corresponding to the line IIc-IIc of FIG. 1.

Next, as shown in FIGS. 26A, 26B, and 27, the second insulating film 15 formed of a silicon dioxide film is formed all over on the first insulating film 14 on the principal surface of the semiconductor substrate 1 by, for example, a CVD method. As the film thickness of the second insulating film 15 affects the depth of the grooves 15a, that is, the level difference between the up and down meanders of the thin film resistance layer 18, the second insulating film 15 is formed to a film thickness of, for example, on the order of 0.3 μm greater than that of the second insulating film 15 according to the first embodiment. Also, it is preferable to form the second insulating film 15 of, for example, a PSG film or teraethoxysilane (TEOS) film having a high fluidity to heat. In this step, the insulating film 16 formed of a composite film including the first insulating film 14 and second insulating film 15 is formed.

Figure 28A:
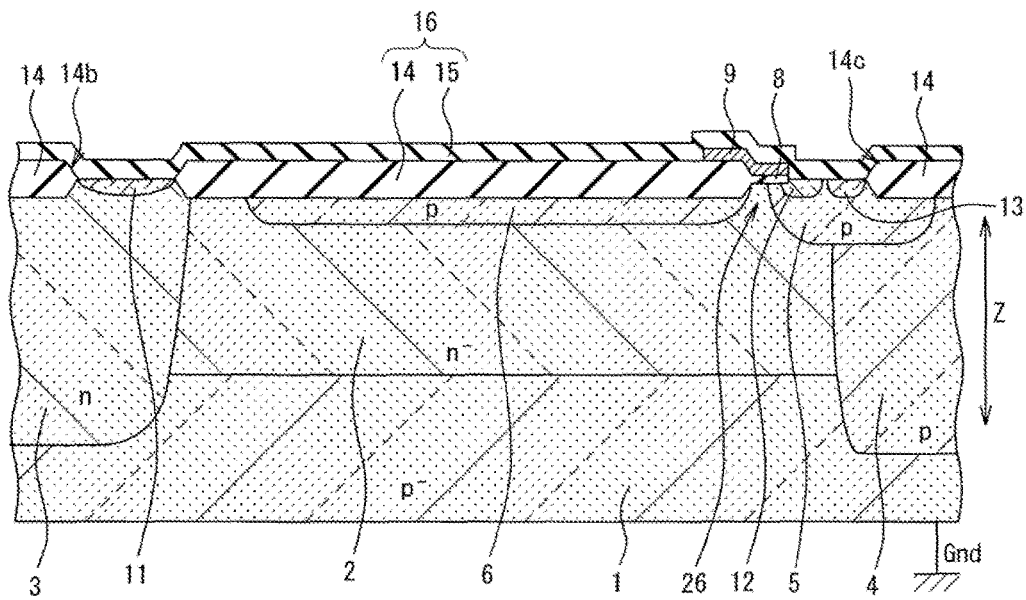
Figure 28B:
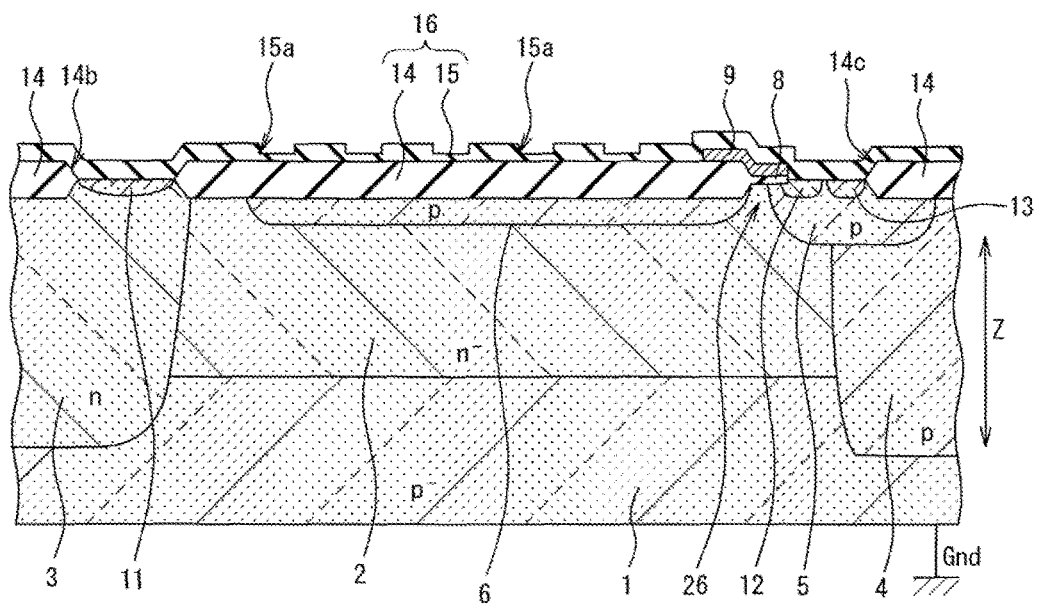
Figure 29:
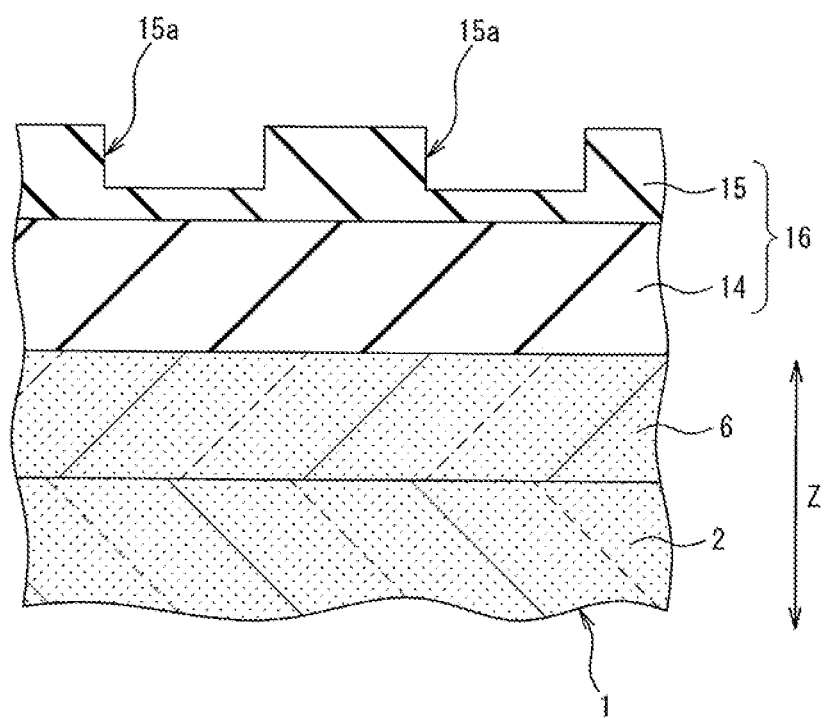
FIG. 29 is a diagram for illustrating the method of manufacturing the semiconductor device according to the sixth embodiment of the invention, and is a sectional view in a position corresponding to the line IIc-IIc of FIG. 1.

Next, as shown in FIGS. 28A, 28B, and 29, a plurality of the grooves 15a are selectively formed in the second insulating film 15 on the breakdown voltage region (offset region 2) of the principal surface of the semiconductor substrate 1. The plurality of grooves 15a are formed by selectively etching the second insulating film 15 using, for example, a photolithography technology or a dry etching technology. The plurality of grooves 15a provided in the second insulating film 15 are spirally formed as a topology of cyclic dot pattern. The plurality of grooves 15a are formed on the breakdown voltage region of the high voltage MOSFET 26 (the breakdown voltage region of the principal surface of the semiconductor substrate 1) in a topology of cyclic continuous (or periodic) dot pattern along the shape pattern of the spiral thin film resistance layer 18 formed in the following step. In this step, the insulating film 16 having the undulations 17 on the front surface, including the first insulating film 14 and second insulating film 15, is formed. Also, the depressions 17a2 of the undulations 17 of the insulating film 16 are formed by the grooves 15a provided in the second insulating film 15. Also, the insulating film 16 is such that a plurality of the depressions 17a2 (the grooves 15a of the second insulating film 15) are disposed in a thin film resistance layer formation region, in which the spiral thin film resistance layer 18 is formed in the subsequent step, as a cyclic dot pattern in the circling direction of the thin film resistance layer formation region.

Figure 30:
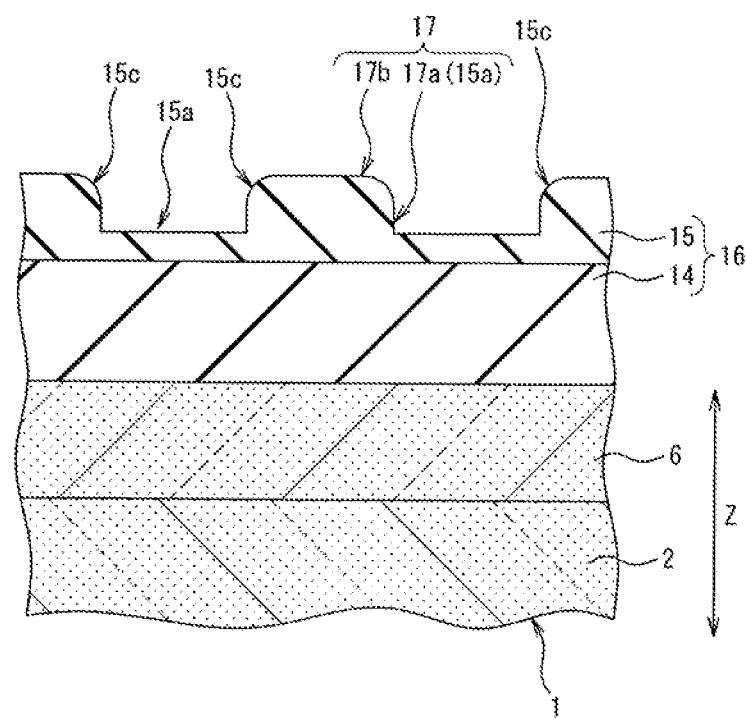
FIG. 30 is a diagram for illustrating the method of manufacturing the semiconductor device according to the sixth embodiment of the invention, and is a sectional view in a position corresponding to the line IIc-IIc of FIG. 1.

Next, heat treatment is performed, and as shown in FIG. 30, the upper edge portions of the grooves 15a of the second insulating film 15 (the corner portions in each of which the front surface of the second insulating film 15 meets the side wall surface of the inner portion of the groove 15a) are gently rounded.

Figure 31A:
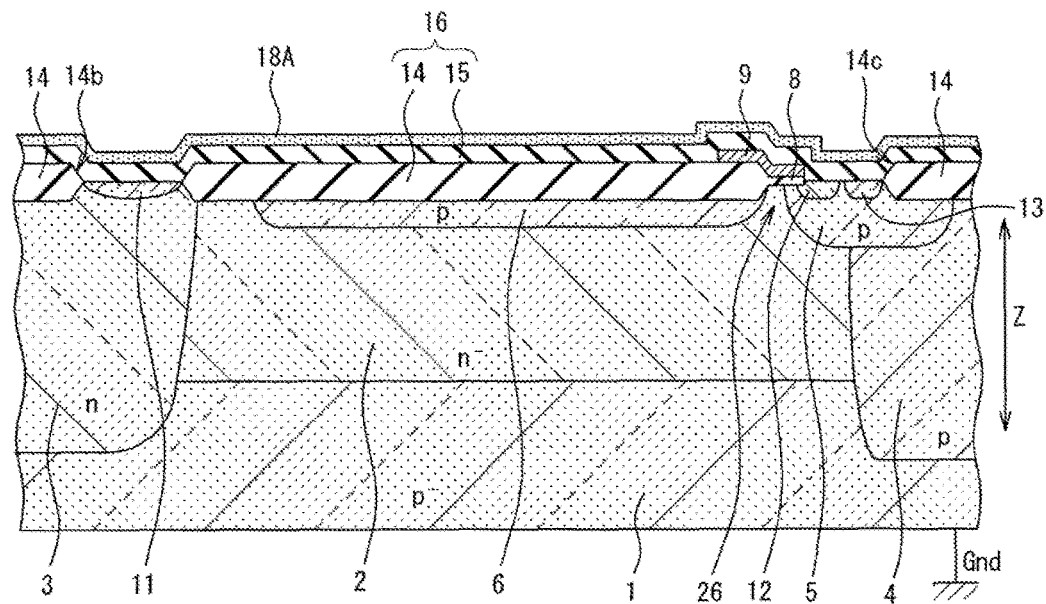
Figure 31B:
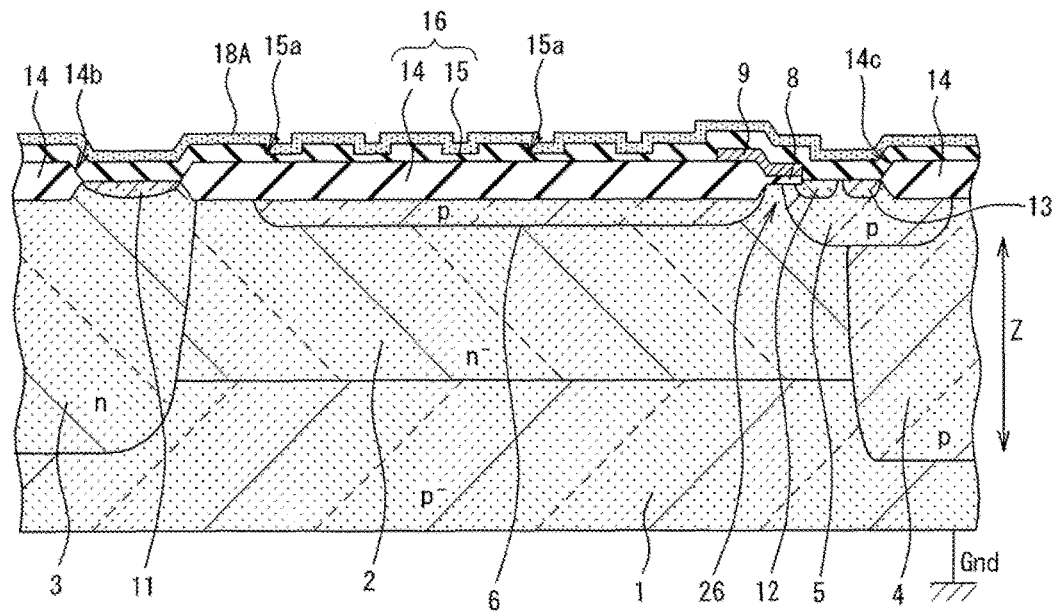
Figure 32:
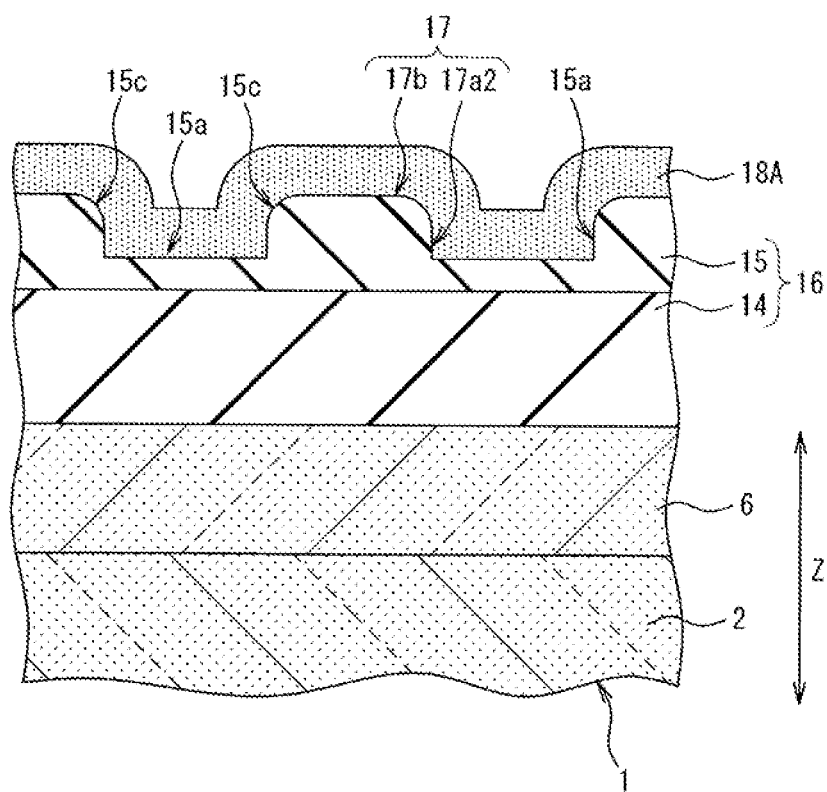
FIG. 32 is a diagram for illustrating the method of manufacturing the semiconductor device according to the sixth embodiment of the invention, and is a sectional view in a position corresponding to the line IIc-IIc of FIG. 1.

Next, as shown in FIGS. 31A, 31B, and 32, the thin film semiconductor layer 18A which oscillates (meanders) cyclically in the thickness direction of the semiconductor substrate 1 is formed on the insulating film 16 so as to reflect or reproduce the undulations 17 of the insulating film 16. The thin film semiconductor layer 18A is formed on the same conditions as, for example, in the first embodiment. The thin film semiconductor layer 18A is formed to a film thickness of, for example, on the order of 0.2 μm such that the undulations 17 of the insulating film 16 are reflected on the thin film semiconductor layer 18A. In this step, the upper edge portions of the depressions 17a2 of the insulating film 16 (upper edge portions 15c of the grooves 15a of the second insulating film 15) are gently rounded, meaning that it is possible to suppress a deterioration in the step coverage of the thin film semiconductor layer 18A formed from the upper surface of the insulating film 16 to the inner portions of the depressions 17a2 (grooves 15a).

Next, the thin film semiconductor layer 18A is selectively etched using a photolithography technology, a dry etching technology, or the like, thus spirally forming the pattern of the spiral thin film resistance layer 18 on the thin film resistance layer formation region of the insulating film 16 on the breakdown voltage region (offset region 2) of the high voltage MOSFET 26, as shown in FIGS. 22A, 22B, and 1. The thin film resistance layer 18 is formed so that one end side thereof overlaps the first main electrode terminal formation region of the first main electrode terminal 21 and the other end side thereof overlaps the second main electrode terminal formation region of the second main electrode terminal 22.

Next, the same steps as in the first embodiment are performed, thus forming the interlayer insulating film 20, the contact holes 20a to 20d, the first main electrode terminal 21, the second main electrode terminal 22, the protection film 23, the rear surface electrode, and the like, thereby substantially completing the wafer process of the semiconductor device 30F according to the sixth embodiment of the invention.

As heretofore described, the semiconductor device 30F according to the sixth embodiment includes, as a resistive field plate, the thin film resistance layer 18 extending spirally while meandering in the thickness direction (Z direction) of the semiconductor substrate 1, in the same way as the semiconductor device 30A according to the first embodiment. Consequently, in the semiconductor device 30F according to the sixth embodiment too, it is possible to achieve a reduction in power consumption when on standby, in the same way as in the semiconductor device 30A according to the first embodiment.

Also, the semiconductor device 30F according to the sixth embodiment is such that the undulations 17 of the front surface of the insulating film 16 reflected on the thin film resistance layer 18 as a pattern in which they oscillate (meander) in the thickness direction of the semiconductor substrate 1 are formed by the presence or absence of the grooves 15a. The grooves 15a can be easily changed in position, shape, and depth. Consequently, the semiconductor device 30F according to the sixth embodiment is such that it is possible to easily form the thin film resistance layer 18 which circles spirally while oscillating (meandering) in the thickness direction of the semiconductor substrate 1.

In the semiconductor device 30F according to the sixth embodiment, a description has been given of the case in which the grooves 15a forming the depressions 17a2 of the undulations 17 of the insulating film 16 are disposed, underneath the thin film resistance layer 18, as a cyclic dot pattern in the circling direction of the thin film resistance layer 18. However, the invention not being limited to this, a configuration may be such that the grooves 15a extend in such a way that the depressions 17a1 configuring the undulations 17 of the insulating film 16, in other words, the depression window portions 14a1 of the first insulating film 14 cross the thin film resistance layer 18 along on the imaginary lines connecting the first main electrode terminal 21 and second main electrode terminal 22, and are disposed in the circling direction of the thin film resistance layer 18, as in the semiconductor device 30C according to the third embodiment.

Also, in the semiconductor device 30F according to the sixth embodiment, a description has been given of the case in which the undulations 17 are formed by providing the grooves 15a in the insulating film 16 including the first insulating film 14 and second insulating film 15. However, the invention not being limited to this, a configuration may be such that undulations are formed by providing grooves in a monolayer insulating film.

Also, in the semiconductor device 30F according to the sixth embodiment, a description has been given of the case in which the semiconductor device 30F includes the high voltage MOSFET 26 as a high voltage element to which a field plate effect is applied. However, the invention not being limited to this, it is possible to apply the invention to a semiconductor device including a high voltage diode, as in the second embodiment and fourth embodiment.

Other Embodiments

As the high voltage MOSFET 26, one in which the p-type offset region 6 is provided has been described, but the offset region 6 does not have to be provided. Also, the p-type offset region 6 shown in the high voltage MOSFET 26 may be provided in the high voltage diode 27. In this case, the offset region 6 may be electrically connected to the second main electrode terminal 22.

In each of the semiconductor devices according to the first to sixth embodiments, the case in which one of the high voltage MOSFET 26 and the high voltage diode 27 is formed has been shown, but the high voltage MOSFET 26 and the high voltage diode 27 can also be formed in one semiconductor device. In this case, it is desirable that the second main electrode terminal 22 is shared, while the first main electrode terminals 21 are separately connected one to each of the $n^+$-type first main electrode region 11 and $n^+$-type first main electrode region 11a. Also, the p-type channel formation region 5 is annularly formed, and the $n^+$-type second main electrode region 12 and the gate electrode 9 are formed in the respective portions of the high voltage MOSFET 26 by sharing the $p^+$-type pickup region 13 and $p^+$-type second main electrode region 13a.

In the semiconductor devices according to the first to sixth embodiments, a description has been given of the case in which a silicon semiconductor substrate is used as the semiconductor substrate, but the invention not being limited to this, it is possible to apply the invention to a semiconductor device using a semiconductor substrate of, for example, silicon carbide (SiC) or gallium nitride (GaN).

Also, in the semiconductor devices according to the first to sixth embodiments, a description has been given of the case in which a polycrystalline semiconductor layer is used as the thin film semiconductor layer used to form the thin film resistance layer, but the invention not being limited to this, it is possible to apply the invention to a semiconductor device using, for example, an amorphous semiconductor layer.

Also, in the semiconductor devices according to the first to sixth embodiments, a description has been given of a semiconductor device including a high voltage MOSFET or high voltage diode as a high voltage active element to which a field plate effect is applied. However, the invention not being limited to this, it is possible to apply the invention to a semiconductor device including, for example, a planar gate IGBT. That is, it is possible to apply the invention to a semiconductor device including a high voltage active element to which a field plate effect is applicable.

A specific description has heretofore been given, based on the heretofore described embodiments, of the invention contrived by the present inventors, but the invention, not being limited to the heretofore described embodiments, can naturally be variously modified without departing from the scope of the invention.

As heretofore described, the semiconductor devices according to the invention are useful for a semiconductor device which has the advantage of being able to achieve a reduction in power consumption when on standby and includes a resistive field plate on the breakdown voltage region of a high voltage active element with an insulating film interposed therebetween.

What is claimed is:
1. A semiconductor device, comprising:
a semiconductor substrate;
a first main electrode terminal disposed on a principal surface of the semiconductor substrate;
a second main electrode terminal provided away from the first main electrode terminal in a position on the principal surface that surrounds the first main electrode terminal;

an insulating film on the principal surface between the first main electrode terminal and the second main electrode terminal; and
a thin film resistance layer having
one end side connected to the first main electrode terminal, and
another end side connected to the second main electrode terminal,
the thin film resistance layer being disposed on the insulating film in a spiral that surrounds the first main electrode terminal and oscillates in a thickness direction of the semiconductor substrate, and being continuous between at least two depressions of a plurality of depressions in the insulating film.

2. The semiconductor device according to claim 1, wherein
the insulating film has the plurality of depressions on a front surface of the insulating film between the first main electrode terminal and the second main electrode terminal, the plurality of depressions being periodically disposed in a direction in which the thin film resistance layer spirals, and
the thin film resistance layer is formed along the plurality of depressions of the insulating film and reflects the plurality of depressions of the insulating film.

3. The semiconductor device according to claim 2, wherein
the plurality of depressions are disposed to form a periodic dot pattern underneath the thin film resistance layer.

4. The semiconductor device according to claim 2, wherein
the plurality of depressions are disposed in straight lines that each cross the direction in which the thin film resistance layer circles.

5. The semiconductor device according to claim 2, wherein
the insulating film is a composite film including
a first insulating film selectively formed of an oxide film formed on the principal surface of the semiconductor substrate so as to provide the plurality of depressions, and
a second insulating film covering the first insulating film.

6. The semiconductor device according to claim 2, wherein
the plurality of depressions are formed by grooves provided in the insulating film.

7. The semiconductor device according to claim 1, further comprising:
a first main electrode region provided in an upper portion of the semiconductor substrate to be connected to the first main electrode terminal; and
a second main electrode region provided in an upper portion of the semiconductor substrate so as to be connected to the second main electrode terminal.

8. The semiconductor device according to claim 7, further comprising:
a gate insulating film; and
a control electrode provided, via the gate insulating film, on an outer side of the thin film resistance layer between the first main electrode region and the second main electrode region.

9. A semiconductor device, comprising:
a semiconductor substrate;
a first main electrode terminal disposed on the semiconductor substrate;
a second main electrode terminal, provided away from the first main electrode terminal, that surrounds the first main electrode terminal; and
a thin film resistance layer having
one end side connected to the first main electrode terminal, and
another end side connected to the second main electrode terminal,
the thin film resistance layer being disposed on the semiconductor substrate, the thin film resistance layer surrounding the first main electrode terminal while oscillating in a thickness direction of the semiconductor substrate.

10. A semiconductor device, comprising:
a semiconductor substrate;
a first main electrode terminal disposed on a principal surface of the semiconductor substrate;
a second main electrode terminal provided away from the first main electrode terminal in a position on the principal surface that surrounds the first main electrode terminal;
an insulating film on the principal surface between the first main electrode terminal and the second main electrode terminal; and
a thin film resistance layer having
one end side connected to the first main electrode terminal, and
another end side connected to the second main electrode terminal,
the thin film resistance layer being disposed on the insulating film in a spiral that surrounds the first main electrode terminal and oscillates in a thickness direction of the semiconductor substrate,
wherein
the insulating film has a plurality of depressions on a front surface of the insulating film between the first main electrode terminal and the second main electrode terminal, the plurality of depressions being periodically disposed in a direction in which the thin film resistance layer spirals,
the thin film resistance layer is formed along the plurality of depressions of the insulating film and reflects the plurality of depressions of the insulating film, and
a side surface of the plurality of depressions of the insulating film is inclined with respect to a bottom surface of the plurality of depressions.

11. A semiconductor device, comprising:
a semiconductor substrate;
a first main electrode terminal disposed on a principal surface of the semiconductor substrate;
a second main electrode terminal provided away from the first main electrode terminal in a position on the principal surface that surrounds the first main electrode terminal;
an insulating film on the principal surface between the first main electrode terminal and the second main electrode terminal; and
a thin film resistance layer having
one end side connected to the first main electrode terminal, and
another end side connected to the second main electrode terminal,
the thin film resistance layer being disposed on the insulating film in a spiral that surrounds the first main electrode terminal and oscillates in a thickness direction of the semiconductor substrate, wherein the insulating film has a plurality of depressions on a front surface of the insulating film between the first main electrode terminal and the second main electrode terminal, the plurality of depressions being periodically disposed in a direction in which the thin film resistance layer spirals, the thin film resistance layer is formed along the plurality of depressions of the insulating film and reflects the plurality of depressions of the insulating film, and the plurality of depressions are disposed in straight lines that each cross the direction in which the thin film resistance layer spirals.

12. A semiconductor device, comprising:

a semiconductor substrate;

a first main electrode terminal disposed on a principal surface of the semiconductor substrate;

a second main electrode terminal provided away from the first main electrode terminal in a position on the principal surface that surrounds the first main electrode terminal;

an insulating film on the principal surface between the first main electrode terminal and the second main electrode terminal; and a thin film resistance layer having
one end side connected to the first main electrode terminal, and
another end side connected to the second main electrode terminal, the thin film resistance layer being disposed on the insulating film in a spiral that surrounds the first main electrode terminal and oscillates in a thickness direction of the semiconductor substrate, wherein the insulating film has a plurality of depressions on a front surface of the insulating film between the first main electrode terminal and the second main electrode terminal, the plurality of depressions being periodically disposed in a direction in which the thin film resistance layer spirals, the thin film resistance layer is formed along the plurality of depressions of the insulating film and reflects the plurality of depressions of the insulating film, and the insulating film is a composite film including
a first insulating film comprising an oxide film on the principal surface of the semiconductor substrate and providing the plurality of depressions, and
a second insulating film covering the first insulating film.

13. The semiconductor device of claim 1, wherein the thin film resistance layer comprises polysilicon.

14. The semiconductor device of claim 9, wherein the thin film resistance layer comprises polysilicon.

15. The semiconductor device of claim 10, wherein the thin film resistance layer comprises polysilicon.

16. The semiconductor device of claim 11, wherein the thin film resistance layer comprises polysilicon.

17. The semiconductor device of claim 12, wherein the thin film resistance layer comprises polysilicon.

* * * * *